US011815997B2

(12) United States Patent
Lim et al.

(10) Patent No.: US 11,815,997 B2
(45) Date of Patent: Nov. 14, 2023

(54) MEMORY CONTROLLERS, MEMORY SYSTEMS, AND MEMORY MODULES

(71) Applicant: SAMSUNG ELECTRONICS CO., LTD., Suwon-si (KR)

(72) Inventors: Suhun Lim, Suwon-si (KR); Kijun Lee, Seoul (KR); Myungkyu Lee, Seoul (KR); Eunchul Kwon, Suwon-si (KR); Hoyoun Kim, Seoul (KR); Jongmin Lee, Hanam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/814,964

(22) Filed: Jul. 26, 2022

(65) Prior Publication Data

US 2023/0147227 A1  May 11, 2023

(30) Foreign Application Priority Data

Nov. 10, 2021 (KR) .......................... 10-2021-0153988
Jan. 10, 2022 (KR) .......................... 10-2022-0003176

(51) Int. Cl.
*H03M 13/00* (2006.01)
*G06F 11/10* (2006.01)
(Continued)

(52) U.S. Cl.
CPC ........ *G06F 11/1068* (2013.01); *G06F 11/076* (2013.01); *G06F 11/0772* (2013.01); *G06F 17/16* (2013.01); *H03M 13/1575* (2013.01)

(58) Field of Classification Search
CPC ............ G06F 11/1068; G06F 11/0773; G06F 11/076; G06F 17/16; H03M 13/1575
See application file for complete search history.

(56) References Cited

U.S. PATENT DOCUMENTS 7,774,651 B2    8/2010  Mukherjee et al.
9,043,674 B2 *  5/2015  Wu .................... H03M 13/616
                                        714/761
(Continued)

FOREIGN PATENT DOCUMENTS

KR    10-2017-0130384    11/2017
KR    10-2021-0026201     3/2021

*Primary Examiner* — Samir W Rizk
(74) *Attorney, Agent, or Firm* — F. CHAU & ASSOCIATES, LLC

(57) ABSTRACT

A memory controller includes an error correction code (ECC) engine and an error managing circuit. The ECC engine is configured to, during a read operation, perform an ECC decoding on a read codeword set to generate a first and second syndrome associated with a correctable error in a user data set included in the read codeword set, correct the correctable error based on the first syndrome and the second syndrome, and provide the second syndrome to the error managing circuit. The error managing circuit is configured to accumulate second syndromes associated with a plurality of correctable errors and obtained through a plurality of read operations as a plurality of second syndromes, store the plurality of second syndromes, compare the plurality of second syndromes with an error pattern set, and predict an occurrence of an uncorrectable error associated with the correctable error in a memory region based on the comparison.

20 Claims, 23 Drawing Sheets

(51) Int. Cl.
*G06F 11/07* (2006.01)
*G06F 17/16* (2006.01)
*H03M 13/15* (2006.01)

(56) References Cited

U.S. PATENT DOCUMENTS

| | | |
|---|---|---|
| 9,691,505 B2 | 6/2017 | Das et al. |
| 10,514,983 B2 | 12/2019 | Eichmeyer et al. |
| 11,163,640 B2 | 11/2021 | Eun et al. |
| 2004/0233767 A1 | 11/2004 | Wu et al. |
| 2014/0181618 A1* | 6/2014 | Wu ................ H03M 13/11 |
| | | 714/761 |
| 2021/0249097 A1 | 8/2021 | Fujishiro et al. |
| 2021/0255923 A1 | 8/2021 | Kim |

* cited by examiner

FIG. 8

OSMb

ZSM

ISM

| R_CNT | C_CNT | BN_CNT | CH_CNT |
|---|---|---|---|
| 1 | 0 | 0 | 0 |

| | EAII | ESBI |
|---|---|---|
| Idx11 → | BA/RA/CA_11 | CID1 |
| Idx12 → | BA/RA/CA_12 | CID1 |

411　413

MEMORY CONTROLLERS, MEMORY SYSTEMS, AND MEMORY MODULES

CROSS-REFERENCE TO RELATED APPLICATIONS

This application claims priority under 35 USC § 119 to Korean Patent Application No. 10-2021-0153988, filed on Nov. 10, 2021, in the Korean Intellectual Property Office, and to Korean Patent Application No. 10-2022-0003176, filed on Jan. 10, 2022, in the Korean Intellectual Property Office, the disclosures of which are incorporated by reference herein in their entirety.

TECHNICAL FIELD

The inventive concept relates generally to memory devices, and more particularly to memory controllers, memory systems, and memory modules.

DISCUSSION OF RELATED ART

A memory device may be implemented using a semiconductor such as silicon (Si), germanium (Ge), gallium arsenide (GaAs), indium phosphide (InP), or the like. Examples of memory devices include volatile memory devices and nonvolatile memory devices. A nonvolatile memory device retains stored data when a power supply is shut down, and a volatile memory device is a memory device in which stored data is lost when a power supply is shut down. An example of volatile memory is dynamic random access memory (DRAM). A volatile memory device can be implemented in a computing system as a working memory, a buffer memory, a main memory, or the like. Accordingly, there is a need in the art for efficient error correction in a memory device.

SUMMARY

Aspects of the present disclosure provide a memory controller, a memory system, and a memory module capable of efficiently managing errors that may occur in a memory device.

According to some aspects of the present disclosure, a memory controller is provided. The memory controller is configured to control a memory module including a plurality of data chips, a first parity chip and a second parity chip. The memory controller includes an error correction code (ECC) engine, a central processing unit (CPU) configured to control the ECC engine, and an error managing circuit. The ECC engine is configured to, during a read operation, perform an ECC decoding on a read codeword set from the memory module to generate a first syndrome and a second syndrome associated with a correctable error in a user data set included in the read codeword set, correct the correctable error based on the first syndrome and the second syndrome, and provide the second syndrome to the error managing circuit. The error managing circuit is configured to accumulate second syndromes associated with a plurality of correctable errors and obtained through a plurality of read operations as a plurality of second syndromes, store the plurality of second syndromes, compare the plurality of second syndromes with an error pattern set, and predict an occurrence of an uncorrectable error associated with the correctable error in a memory region of the plurality of data chips based on the comparison.

According to some aspects of the present disclosure, a memory system is provided. The memory system includes a memory module including a plurality of data chips, a first parity chip, and a second parity chip. The memory system further includes a memory controller configured to control the memory module and including an error correction code (ECC) engine, a central processing unit (CPU) configured to control the ECC engine, and an error managing circuit. The ECC engine is configured to, during a read operation, perform an ECC decoding on a read codeword set received from the memory module to generate a first syndrome and a second syndrome. The read codeword set includes a user data set, the second syndrome is associated with a correctable error, and the user data set includes the correctable error. The ECC engine is further configured to correct the correctable error in the user data set based on the first syndrome and the second syndrome and provide the second syndrome to the error managing circuit. The error managing circuit is configured to obtain second syndromes associated with a plurality of correctable errors through a plurality of read operations, accumulate the second syndromes as a plurality of second syndromes, store the plurality of second syndromes, compare the plurality of second syndromes with at least one error pattern set, and predict an occurrence of an uncorrectable error in a memory region of the plurality of data chips associated with the plurality of correctable errors based on the comparison.

According to some aspects of the present disclosure, a memory module is provided. The memory module includes a plurality of data chips configured to store a user data set and meta data, a first parity chip and a second parity chip configured to store first parity data and second parity data, respectively, the first parity data and the second parity data being generated based on the user data set and the meta data, and a buffer chip configured to provide the user data set and the meta data to the plurality of data chips based on a command and an address provided from an external memory controller and further configured to provide the first parity data and the second parity data to the first parity chip and the second parity chip, respectively. The buffer chip includes an error correction code (ECC) engine, a memory management unit configured to control the ECC engine, and an error managing circuit. The ECC engine is configured to, during a read operation, perform an ECC decoding on a read codeword set received from the memory module to generate a first syndrome and a second syndrome. The read codeword set includes a user data set, the second syndrome is associated with a correctable error, and the user data set includes the correctable error. The ECC engine is further configured to correct the correctable error in the user data set based on the first syndrome and the second syndrome and provide the second syndrome to the error managing circuit. The error managing circuit is configured to obtain second syndromes associated with a plurality of correctable errors through a plurality of read operations, accumulate the second syndromes as a plurality of second syndromes, store the plurality of second syndromes, compare the plurality of second syndromes with at least one error pattern set, and predict an occurrence of an uncorrectable error in a memory region of the plurality of data chips associated with the plurality of correctable errors based on the comparison.

Accordingly, in some embodiments, an error managing circuit may accumulate a plurality of syndromes obtained through a plurality of read operations, may predict an occurrence of an uncorrectable error in a memory region of a plurality of data chips associated with a correctable error based on the plurality of syndromes, and may determine an error management policy for the memory region based on the plurality of syndromes. Therefore, the error managing circuit may inhibit an occurrence of an uncorrectable error in a memory device due to accumulated correctable errors.

BRIEF DESCRIPTION OF THE DRAWINGS

The above and other aspects and features of the present disclosure will become more apparent by describing in detail embodiments thereof with reference to the accompanying drawings, in which:

FIG. 8 illustrates an example of a base offset sub matrix that is used for generating the offset sub matrices of the first parity sub matrix of FIG. 7 according to at least one embodiment;

FIG. 9 illustrates an example of a zero sub matrix in the parity generation matrix of FIG. 7 according to at least one embodiment;

FIG. 10 illustrates an example of an identity sub matrix in the parity generation matrix of FIG. 7 according to at least one embodiment;

FIG. 20 illustrates an example of a counted value of FIG. 19 according to at least one embodiment;

FIG. 21 illustrates an example of an error address register of FIG. 19 according to at least one embodiment;

DETAILED DESCRIPTION

Figure 1:
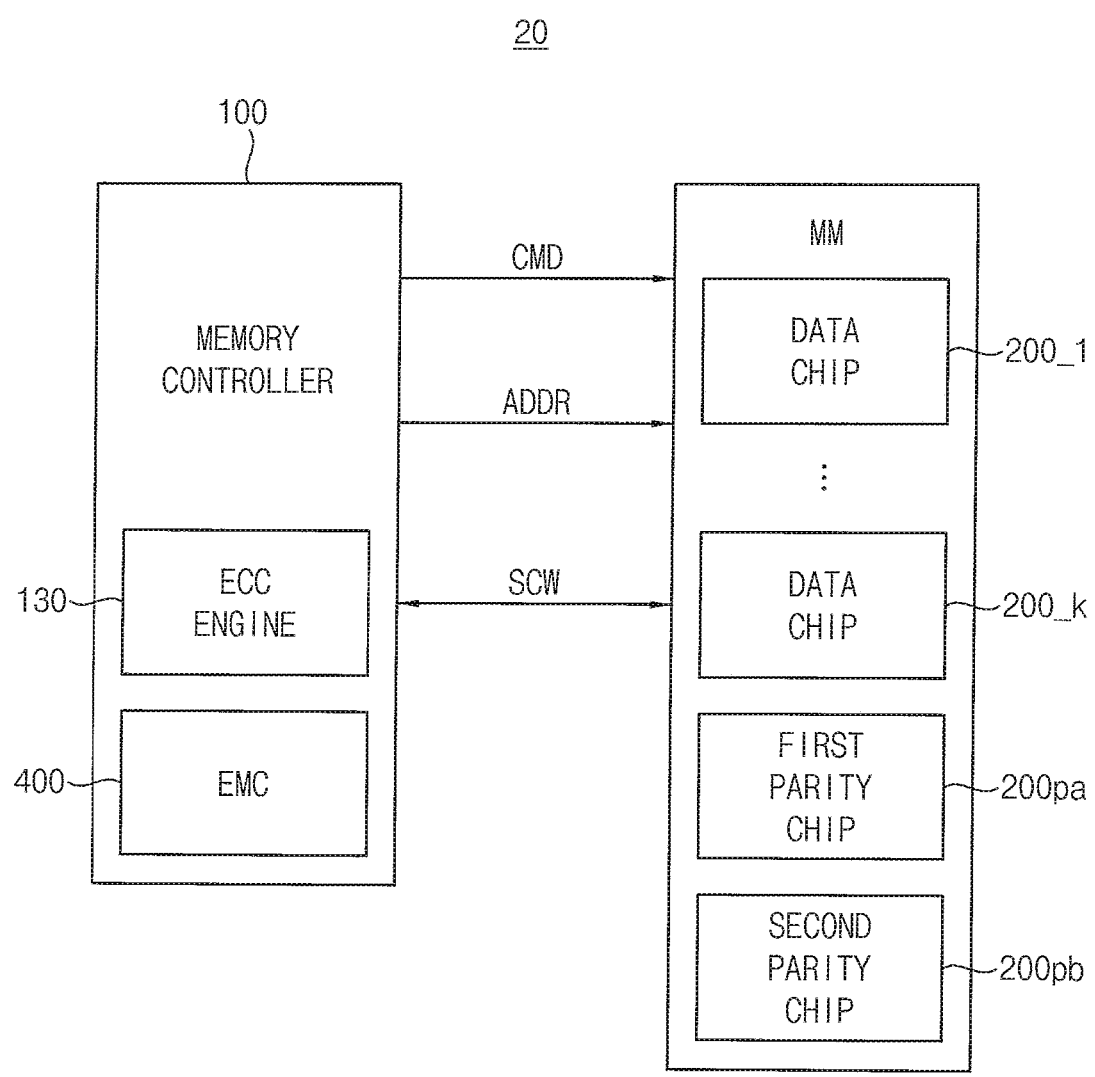
FIG. 1 is a block diagram of a memory system according to at least one embodiment.

Embodiments of the present disclosure will be described more fully hereinafter with reference to the accompanying drawings. Like reference numerals may refer to like elements throughout the accompanying drawings. As used herein, the singular forms "a", "an", and "the" are intended to include the plural forms as well, unless the context clearly indicates otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments.

FIG. 1 is a block diagram of a memory system according to at least one embodiment.

Referring to FIG. 1, according to some aspects, a memory system 20 includes a memory controller 100 and a memory module MM. According to some aspects, the memory module MM includes a plurality of memory chips. According to some aspects, the plurality of memory chips includes a plurality of data chips 200_1 to 200_k, a first parity chip 200pa, and a second parity chip 200pb. Each of the plurality of memory chips may be referred to as a semiconductor memory device or as a memory device.

According to some aspects, the memory controller 100 controls an overall operation of the memory system 20. In some embodiments, the memory controller 100 controls an overall data exchange between a host and the plurality of memory chips. In an example, the memory controller 100 writes data in the plurality of memory chips or reads data from the plurality of memory chips in response to a request from the host.

According to some aspects, the memory controller 100 issues operation commands to the plurality of memory chips for controlling the plurality of memory chips.

In some embodiments, each of the plurality of memory chips includes a volatile memory cell, such as a dynamic random access memory (DRAM) cell.

In some embodiments, the plurality of data chips 2001 to 200_k includes k data chips. In some embodiments, k is 16. In some embodiments, k is less than or greater than 16. Each data chip of the plurality of data chips 200_1 to 200_k may be referred to as a data memory. Each of the first parity chip 200*pa* and the second parity chip 200*pb* may be referred to as an error correction code (ECC) memory or as a redundant memory.

According to some aspects, the memory controller 100 transmits an address ADDR and a command CMD to the memory module MM. According to some aspects, the memory controller 100 exchanges a codeword set SCW with the memory module MM.

According to some aspects, the memory controller 100 includes an ECC engine 130. In some embodiments, the ECC engine 130 performs an ECC encoding on a user data set and meta data. In some embodiments, the encoding includes generating a parity data set using a parity generation matrix to obtain a codeword set SCW. In some embodiments, the codeword set SCW includes the user data set, the meta data, and the parity data set. In some embodiments, the ECC engine 130 provides the codeword set SCW to the memory module MM in a write operation of the memory system 20. In some embodiments, the user data set is stored in the plurality of data chips 200_1 to 200_*k*. In some embodiments, the meta data and a first portion of the parity data set is stored in the first parity chip 200*pa*. In some embodiments, a second portion of the parity data set is stored in the second parity chip 200*pb*.

According to some aspects, the ECC engine 130 performs an ECC decoding on the codeword set SCW read from the memory module MM using a parity check matrix to generate a first syndrome and a second syndrome. As used herein, a "syndrome" is a numerical representation of an error. In some embodiments, the ECC engine 130 corrects a correctable error in the user data set included in the codeword set SCW based on the first syndrome. In some embodiments, the ECC engine 130 corrects a correctable error in the user data set included in the codeword set SCW based on the second syndrome.

According to some aspects, the memory controller 100 includes an error managing circuit (EMC) 400. In some embodiments, the EMC 400 obtains the second syndrome via a read operation. In some embodiments, the EMC 400 stores the second syndrome associated with the correctable error. In some embodiments, the EMC 400 accumulates a plurality of second syndromes associated with a plurality of correctable errors via a plurality of read operations. In some embodiments, the EMC 400 stores the plurality of second syndromes.

In some embodiments, the EMC 400 predicts an occurrence of an uncorrectable error in a memory region of the plurality of data chips 200*l* to 200_*k* associated with the plurality of correctable errors by comparing the plurality of second syndromes with at least one of a first error pattern set and a second error pattern set. According to some aspects, the EMC 400 identifies that a pattern of the plurality of second syndromes corresponds to a risky error pattern based on the comparison. According to some aspects, based on the identification, the EMC 400 predicts that a probability of the occurrence of the uncorrectable error is greater than a reference probability. According to some aspects, the EMC 400 repairs the at least one memory region based on the prediction.

Accordingly, by repairing the memory region, the EMC 400 reduces an accumulation of correctable errors and reduces the occurrence of the uncorrectable error due to the accumulation of the correctable errors.

Figure 2:
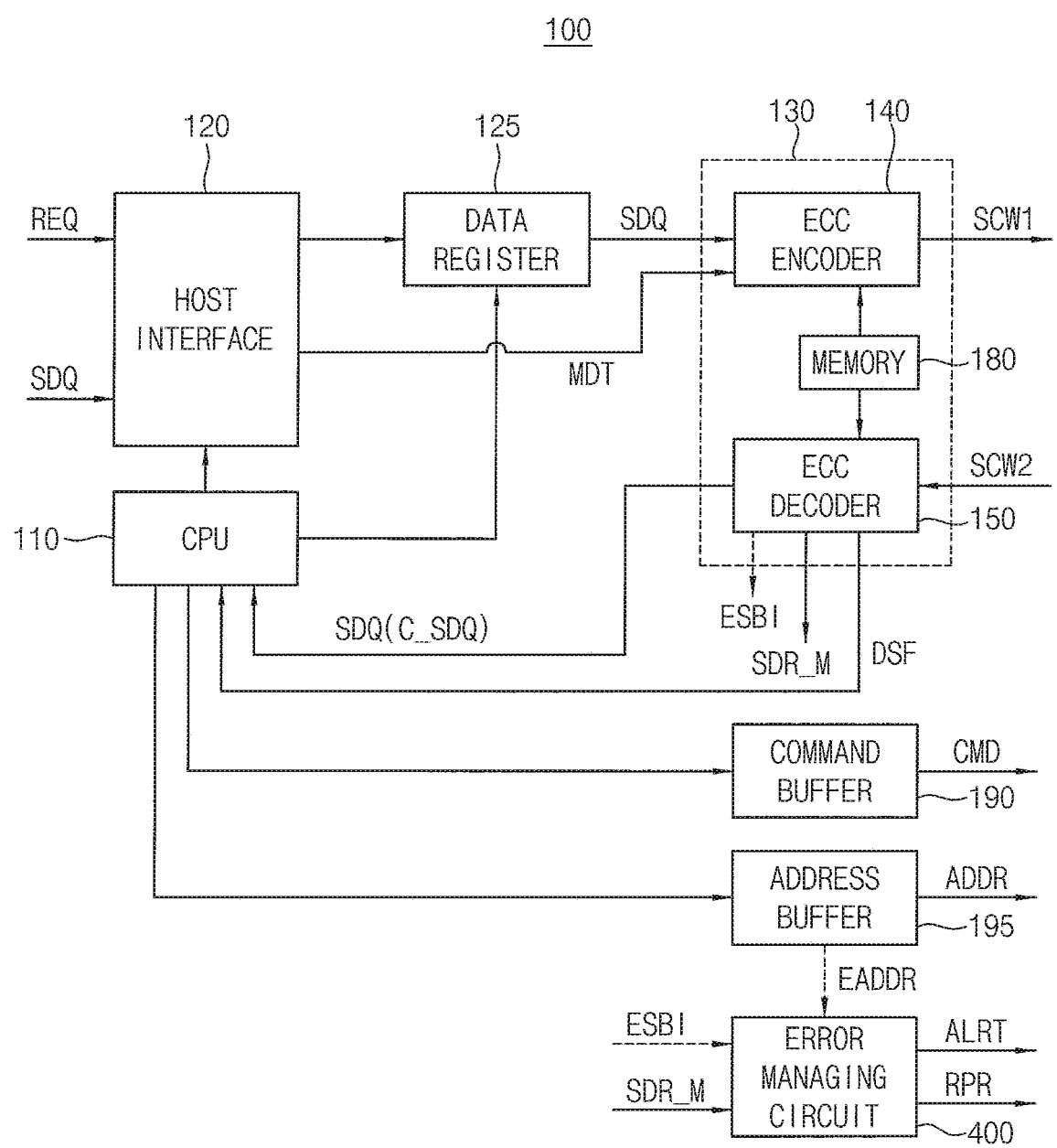
FIG. 2 is block diagram of a memory controller of the memory system of FIG. 1 according to at least one embodiment.

FIG. 2 is block diagram of a memory controller of the memory system of FIG. 1 according to at least one embodiment.

Referring to FIG. 2, according to some aspects, the memory controller 100 includes a central processing unit (CPU) 110, a host interface 120, a data register 125, the ECC engine 130, a command buffer 190, an address buffer 195, and the EMC 400. According to some aspects, the ECC engine 130 includes an ECC encoder 140, an ECC decoder 150, and a memory (e.g., an ECC memory) 180.

According to some aspects, the host interface 120 receives a request REQ and a user data set SDT from the host. According to some aspects, the host interface 120 generates meta data MDT associated with the user data set SDT. According to some aspects, the host interface 120 provides the user data set SDT to the data register 125 and provides the meta data MDT to the ECC encoder 140. According to some aspects, the data register 125 continuously or sequentially outputs the user data set SDT to the ECC engine 130.

According to some aspects, the ECC encoder 140 performs an ECC encoding on the user data set SDQ and the meta data MDT using a parity generation matrix to generate a first codeword set SCW1. According to some aspects, the ECC encoder 140 provides the first codeword set SCW1 to the memory module described with reference to FIG. 1.

According to some aspects, the ECC decoder 150 receives the second codeword set SCW2 from the memory module described with reference to FIG. 1. According to some aspects, the second codeword set includes the user data set SDQ and the meta data MDT. According to some aspects, the ECC decoder 150 performs an ECC decoding on the second codeword set SCW2 using the parity check matrix to output a decoding status flag DSF to the CPU 110 and to generate a first syndrome and a second syndrome SDR_M. According to some aspects, the ECC decoder 150 corrects a correctable error in the user data set SDQ included in the second codeword set SCW2 on a symbol basis to obtain a corrected user data set C_SDQ. According to some aspects, a symbol corresponds to a plurality of data bits in the user data set SDQ read from a data chip of the plurality of data chips. For example, a data unit read from a data chip included in the user data set SDQ may be referred to as a symbol.

According to some aspects, the ECC decoder 150 provides the corrected user data set C_SDQ to the CPU 110. According to some aspects, the ECC decoder 150 does not detect a correctable error in the user data set SDQ and provides the user data set SDQ to the CPU 110.

According to some aspects, the ECC decoder 150 provides the second syndrome SDR_M associated with the correctable error to the EMC 400. According to some aspects, the ECC decoder 150 provides error symbol information ESBI associated with a symbol in which a correctable error occurs to the EMC 400.

According to some aspects, the memory 180 stores the parity generation matrix and the parity check matrix.

According to some aspects, the CPU 110 receives the user data set SDQ or the corrected user data set C_SDQ and controls the ECC engine 130, the command buffer 190, and the address buffer 195 via control signals in response to receiving the user data set SDQ or the corrected user data set C_SDQ. In an example, the command buffer 190 stores the command CMD corresponding to the request REQ and transmits the command CMD to the memory module MM in response to a first control signal received from the CPU 110.

In another example, the address buffer 195 stores the address ADDR and transmits the address ADDR to the memory module MM in response to a second control signal received from the CPU 110. In some embodiments, the address buffer 195 provides an error address EADDR associated with the correctable error to the EMC 400.

According to some aspects, the EMC 400 accumulates a plurality of second syndromes SDR_M associated with a plurality of correctable errors obtained via a plurality of read operations and stores the plurality of second syndromes SDR_M on the memory module MM. According to some aspects, the EMC 400 predicts an occurrence of an uncorrectable error in a memory region of the plurality of data chips described with reference to FIG. 1 based on the plurality of second syndromes SDR_M.

According to some aspects, the EMC 400 determines an error management policy for the memory region based on the prediction. According to some aspects, the EMC 400 provides an alert signal ALRT and a repair signal RPR to the CPU 110 based on the prediction. According to some aspects, the CPU 110 is configured to identify a possibility of an occurrence of an uncorrectable error in response to receiving the alert signal ALRT. According to some aspects, the repair signal RPR is associated with repairing the memory region.

In some embodiments, the EMC 400 receives error addresses EADDR associated with correctable errors detected in a plurality of read operations on the memory module MM from the address buffer 195. According to some aspects, the EMC 400 counts the error addresses EADDR and predicts the occurrence of the uncorrectable error based on the counting. According to some aspects, the EMC 400 predicts the occurrence of the uncorrectable error based on the error symbol information ESBI.

Figure 3:
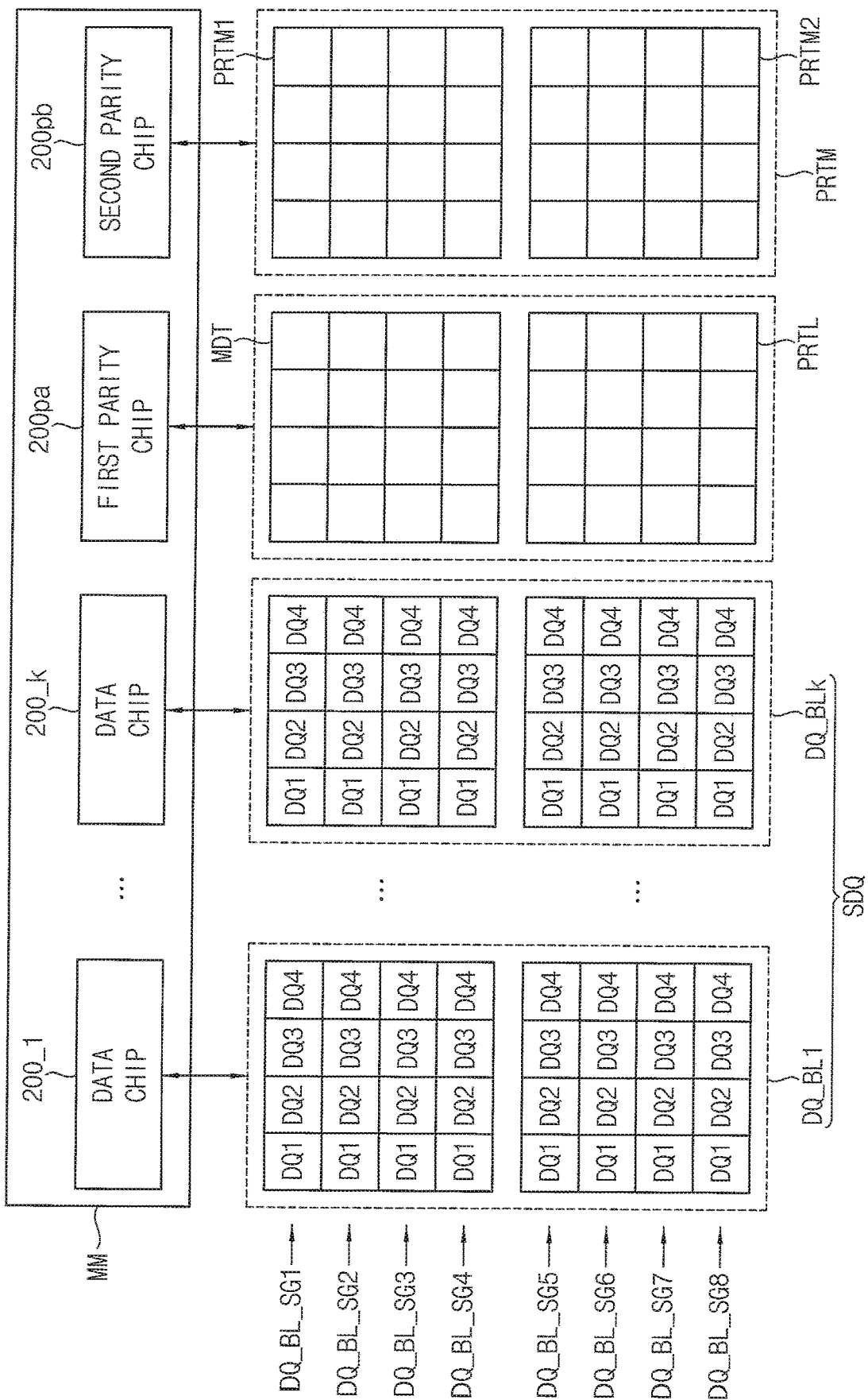
FIG. 3 illustrates data segments corresponding to a burst length in the memory system of FIG. 1 according to at least one embodiment.

FIG. 3 illustrates data segments corresponding to a burst length in the memory system of FIG. 1 according to at least one embodiment.

Referring to FIG. 3, according to some aspects, each of the plurality of data chips 200_1 to 200_k, the first parity chip 200pa, and the second parity chip 200pb performs a burst operation.

In some embodiments, a burst operation is an operation of writing or reading a large amount of data by sequentially increasing or decreasing an initial address provided from the memory controller 100. In some embodiments, a basic unit of the burst operation is a burst length. In an example, a burst length is a number of units of data transferred during the burst operation. In the example of FIG. 3, the burst length is 8. According to some aspects, the burst length is less than or greater than eight.

Referring to FIG. 3, in some embodiments, the data sets DQ_BL1 to DQ_BLk are respectively input to and/or output from corresponding data chips of the plurality of data chips 200_1 to 200_k. In some embodiments, each of the data sets DQ_BL1 to DQ_BLk includes data segments DQ_BL_SG11 to DQ_BL_SG18 respectively corresponding to the burst length of eight. According to some aspects, there are more than or fewer than eight data segments, as determined by the burst length. In some embodiments, the data sets DQ_BL1 to DQ_BLk correspond to the user data set SDQ. In an example, the data sets DQ_BL1 to DQ_BLk are included in the user data set SDQ. According to some aspects, data units DQ1 to DQ4 of the user data SDQ are read to and/or written from the plurality of data chips 200_1 to 200_k. In some embodiments, each of data units DQ1 to DQ4 are referred to as a symbol.

According to some aspects, while the burst operation is performed in the plurality of data chips 200_1 to 200_k, meta data MDT and first parity data PRTL corresponding to the burst length are input to and/or output from the first parity chip 200pa, and first sub parity data PRTM1 and second sub parity data PRTM2 corresponding to the burst length are input to and/or output from the second parity chip 200pb. According to some aspects, second parity data PRTM includes the first sub parity data PRTM1 and the second sub parity data PRTM2.

According to some aspects, the first parity data PRTL is referred to as an error locator parity data and is associated with locations of error bits in the user data set SDQ. According to some aspects, the second parity data PRTM is referred to as an error magnitude parity data and is associated with a magnitude of (e.g., number of) error bits in the user data set SDQ.

Figure 4:
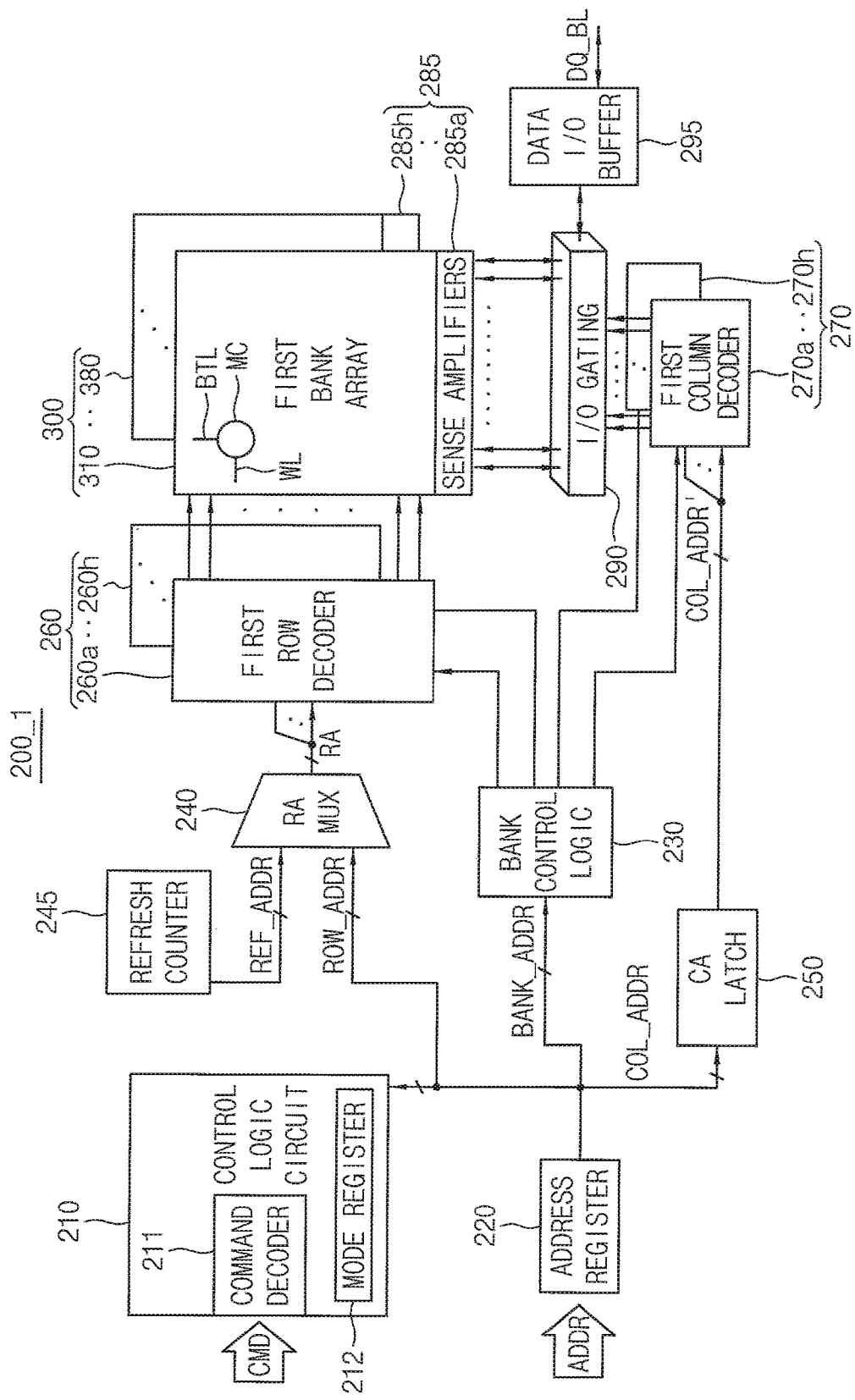
FIG. 4 is a block diagram of a data chip of a memory module of FIG. 1 according to at least one embodiment.

FIG. 4 is a block diagram of a data chip of the memory module of FIG. 1 according to at least one embodiment.

Referring to FIG. 4, according to some aspects, the data chip 200_1 includes a control logic circuit 210, an address register 220, a bank control logic 230, a row address multiplexer 240, a refresh counter 245, a column address latch 250, a row decoder 260, a column decoder 270, a sense amplifier unit 285, an input/output (I/O) gating circuit 290, a data I/O buffer 295, and a memory cell array 300.

According to some aspects, the memory cell array 300 includes first through eighth bank arrays 310 to 380. According to some aspects, the row decoder 260 includes first through eighth row decoders 260a to 260h coupled to first through eighth bank arrays 310 to 380, respectively. According to some aspects, the column decoder 270 includes first through eighth column decoders 270a to 270h coupled to the first through eighth bank arrays 310 to 380, respectively. According to some aspects, the sense amplifier unit 285 includes first through eighth sense amplifiers 285a to 285h coupled to the first through eighth bank arrays 310 to 380, respectively.

According to some aspects, the first through eighth bank arrays 310 to 380, the first through eighth row decoders 260a to 260h, the first through eighth column decoders 270a to 270h, and the first through eighth sense amplifiers 285a to 285h form first through eighth banks. In some embodiments, each of the first through eighth bank arrays 310 to 380 include a plurality of word-lines WL, a plurality of bit-lines BL, and a plurality of memory cells MC formed at intersections of the word-lines WL and the bit-lines BTL. In the example of FIG. 4, the data chip 2001 includes eight banks. According to some aspects, the data chip 200_1 includes fewer than or more than eight banks, and respectively fewer or more than eight bank arrays, row decoders, column decoders, and sense amplifiers corresponding to the banks.

According to some aspects, the address register 220 receives an address ADDR including a bank address BANK_ADDR, a row address ROW_ADDR, and a column address COL_ADDR from the memory controller 100. According to some aspects, the address register 220 provides the received bank address BANK_ADDR to the bank control logic 230. According to some aspects, the address register 220 provides the received row address ROW_ADDR to the row address multiplexer 240. According to some aspects, the address register 220 provides the received column address COL_ADDR to the column address latch 250.

According to some aspects, the bank control logic 230 generates a bank control signal in response to the bank address BANK_ADDR. In some embodiments, a row decoder of the first through eighth row decoders 260a to 260h corresponding to the bank address BANK_ADDR is activated in response to the bank control signal. In some embodiments, a column decoder of the first through eighth column decoders 270a to 270h corresponding to the bank address BANK_ADDR is activated in response to the bank control signal.

According to some aspects, the row address multiplexer 240 receives the row address ROW_ADDR from the address register 220 and receives a refresh row address REF_ADDR from the refresh counter 245. According to some aspects, the row address multiplexer 240 selectively outputs the row address ROW_ADDR or the refresh row address REF_ADDR as a row address RA. According to some aspects, the row address RA that is output from the row address multiplexer 240 is applied to the first through eighth row decoders 260a to 260h.

According to some aspects, the activated row decoder of the first through eighth row decoders 260a to 260h decodes the row address RA that is output from the row address multiplexer 240 and activates a word-line WL corresponding to the row address RA. In an example, the activated row decoder generates a word-line driving voltage and applies the word-line driving voltage to the word-line WL corresponding to the row address RA.

According to some aspects, the column address latch 250 receives the column address COL_ADDR from the address register 220 and temporarily stores the received column address COL_ADDR. In some embodiments, in a burst mode, the column address latch 250 generates column addresses COL_ADDR' that increment from the received column address COL_ADDR. According to some aspects, the column address latch 250 applies the temporarily stored column address COL_ADDR or a generated column address COL_ADDR' to the first through eighth column decoders 270a to 270h.

According to some aspects, the activated column decoder of the first through eighth column decoders 270a to 270h decodes the temporarily stored column address COL_ADDR or the generated column address COL_ADDR' that is respectively output from the column address latch 250 and controls the I/O gating circuit 290 to output data corresponding to the temporarily stored column address COL_ADDR or the generated column address COL_ADDR'.

According to some aspects, the I/O gating circuit 290 includes circuitry for gating input/output data. According to some aspects, the I/O gating circuit 290 includes read data latches for storing data that is output from the first through eighth bank arrays 310 to 380, and write drivers for writing data to the first through eighth bank arrays 310 to 380.

According to some aspects, data to be read from a bank array of the first through eighth bank arrays 310 to 380 is sensed by a sense amplifier coupled to the bank array from which the data is to be read and is stored in the read data latches.

According to some aspects, the data stored in the read data latches is provided to the memory controller 100 via the data I/O buffer 295. According to some aspects, a data set DQ_BL to be written in a bank array of the first through eighth bank arrays 310 to 380 is provided to the data I/O buffer 295 from the memory controller 100. According to some aspects, the data I/O buffer 295 provides the data set DQ_BL to the I/O gating circuit 290.

According to some aspects, the control logic circuit 210 controls operations of the data chip 200_1. In an example, the control logic circuit 210 generates control signals for the data chip 200_1 such that the data chip 200_1 performs the write operation and/or the read operation. According to some aspects, the control logic circuit 210 includes a command decoder 211 that decodes the command CMD received from the memory controller 100. According to some aspects, the control logic circuit 210 includes a mode register 212 that sets an operation mode of the data chip 200_1.

According to some aspects, each of the first parity chip 200pa and the second parity chip 200pb have a similar or substantially similar configuration as the data chip 200_1. According to some aspects, each of the first parity chip 200pa and the second parity chip 200pb input and/or output corresponding parity data.

Figure 5:
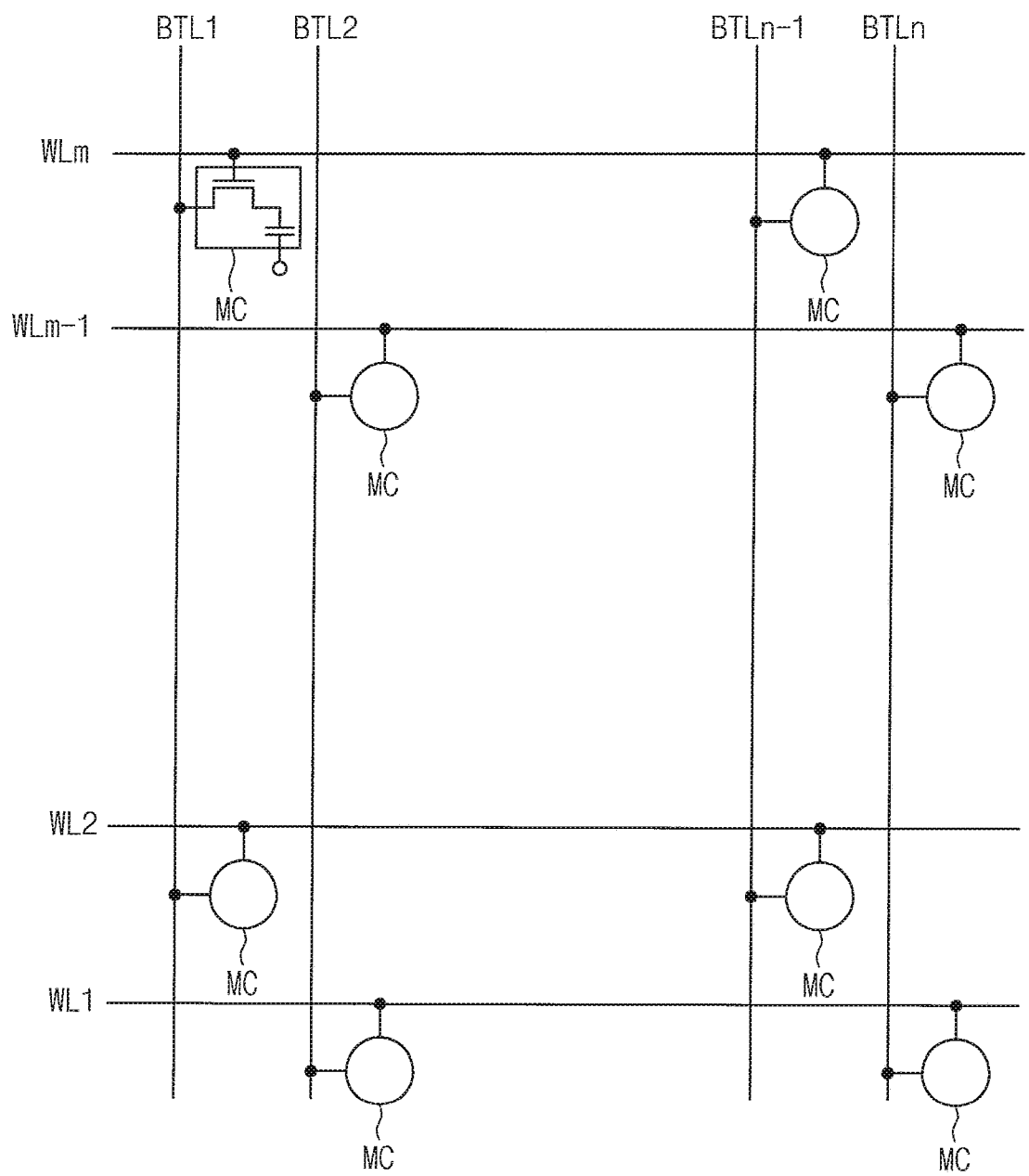
FIG. 5 illustrates a first bank array of the data chip of FIG. 4 according to at least one embodiment.

FIG. 5 illustrates a first bank array of the data chip of FIG. 4 according to at least one embodiment.

Referring to FIG. 5, according to some aspects, the first bank array 310 includes a plurality of word-lines WL1 to WLm (where m is a natural number greater than three), a plurality of bit-lines BTL1 to BTLn (where n is a natural number greater than three), and a plurality of memory cells MCs disposed near intersections between the word-lines WL1 to WLm and the bit-lines BTL1 to BTLn. According to some aspects, m is a natural number equal to or greater than two. In some embodiments, n is a natural number equal to or greater than two. In some embodiments, each of memory cell of the plurality of memory cells MCs includes a DRAM cell structure.

In some embodiments, the plurality of word-lines WL1 to WLm to which the plurality of memory cells MCs are connected are referred to as rows of the first bank array 310 and the plurality of bit-lines BL1 to BLn to which the plurality of memory cells MCs are connected are referred to as columns of the first bank array 310.

Figure 6:
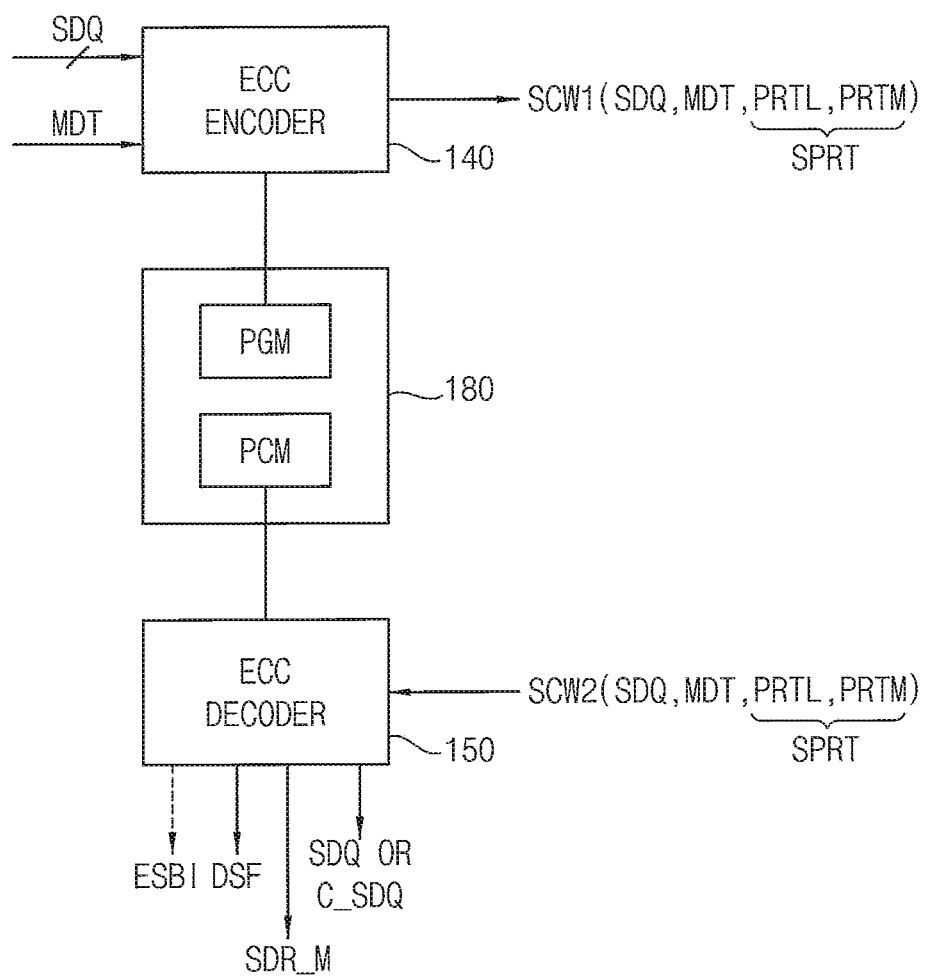
FIG. 6 is a block diagram of an ECC engine of FIG. 2 according to at least one embodiment.

FIG. 6 is a block diagram of the ECC engine of the memory controller of FIG. 2 according to at least one embodiment.

Referring to FIG. 6, according to some aspects, the ECC engine 130 includes the ECC encoder 140, the ECC decoder 150, and the memory 180. In some embodiments, the memory 180 is referred to as an ECC memory.

According to some aspects, the memory 180 is connected to the ECC encoder 140 and the ECC decoder 150. According to some aspects, the memory 180 stores a parity generation matrix PGM and a parity check matrix PCM.

According to some aspects, the ECC encoder 140 performs an ECC encoding on the user data set SDQ and the meta data MBT using the parity generation matrix PCM to generate a parity data set SPRT including the first parity data PRTL and the second parity data PRTM. According to some aspects, the ECC encoder 140 generates a first codeword set SCW1 including the user data set SDQ, the meta data MBT, and the parity data set SPRT, and outputs the first codeword set SCW1.

According to some aspects, the ECC decoder 150 receives a second codeword set SCW2 including the user data set SDQ, the meta data MBT, and the parity data set SPRT from a memory module MM described with reference to FIG. 1. According to some aspects, the ECC decoder 150 performs an ECC decoding on the second codeword set SCW2 using the parity check matrix PCM to generate a first syndrome and a second syndrome SDR_M. According to some aspects, the ECC decoder 150 corrects a correctable error in the user data set SDQ included in the second codeword set SCW2 on a symbol basis based on the first syndrome and the second syndrome SDR_M. According to some aspects, the ECC decoder 150 outputs a decoding status flag DSF indicating that a correctable error is corrected. According to some aspects, the ECC decoder 150 outputs the decoding status flag DSF when the ECC decoder 150 outputs corrected user data set C_SDQ. According to some aspects, the ECC decoder 150 provides the second syndrome SDR_M associated with the correctable error to the EMC 400 described with reference to FIG. 2. In some embodiments, the ECC decoder 150 provides error symbol information ESBI to the EMC 400 described with reference to FIG. 2.

Figure 7:
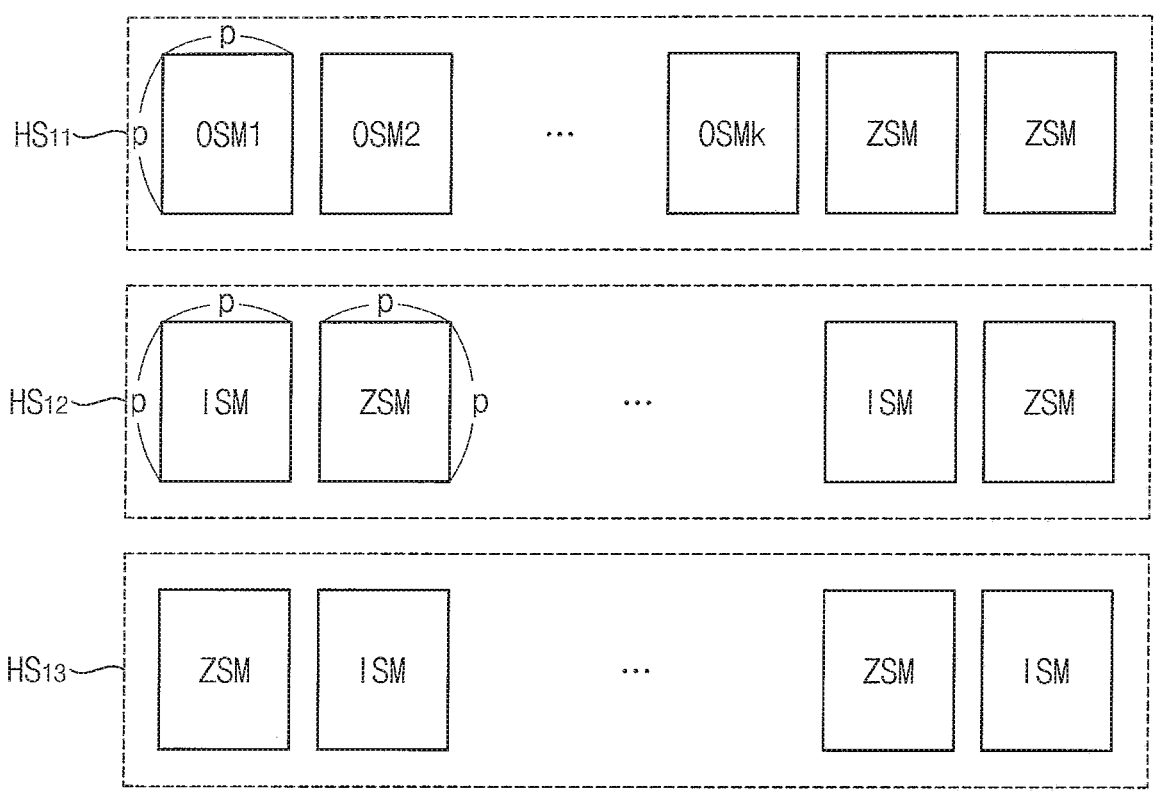
FIG. 7 illustrates a parity generation matrix stored in memory of the ECC engine of FIG. 6 according to at least one embodiment.

FIG. 7 illustrates a parity generation matrix stored in memory of the ECC engine of FIG. 6 according to at least one embodiment.

Referring to FIG. 7, according to some aspects, the parity generation matrix PGM includes a first parity sub matrix $HS_{11}$, a second parity sub matrix $HS_{12}$, and a third parity sub matrix $HS_{13}$.

According to some aspects, the first parity sub matrix $HS_n$ includes a plurality of offset sub matrices OSM1 to OSMk respectively corresponding to the plurality of data chips 200_1 to 200_k described with reference to FIG. 1, a first zero sub matrix ZSM1 corresponding to the first parity chip 200pa described with reference to FIG. 1, and a second zero sub matrix ZSM2 corresponding to the second parity chip 200pb described with reference to FIG. 1. According to some aspects, each offset sub of the plurality of offset sub matrices OSM1 to OSMk, the first zero sub matrix ZSM1, and the second zero sub matrix ZSM2 includes p×p elements, where p is a natural number greater than one.

According to some aspects, each of the second parity sub matrix $HS_{12}$ and the third parity sub matrix $HS_{13}$ includes (k+1) identity sub matrices ISM and (k+1) zero sub matrices ZSM, where k is a natural number. According to some aspects, each of the (k+1) identity sub matrices ISM and the (k+1) zero sub matrices ZSM include p×p elements, where p is a natural number greater than one. According to some aspects, the (k+1) identity sub matrices ISMs and the (k+1) zero sub matrices ZSMs may be alternatingly arranged. In an example, in each of the second parity sub matrix $HS_{12}$ and the third parity sub matrix $HS_{13}$, an identity sub matrix ISM may be included between a proximate pair of zero sub matrices ZSM, and a zero sub matrix ZSM may be included between a proximate pair of identity sub matrices ISM.

Figures 8, 9:
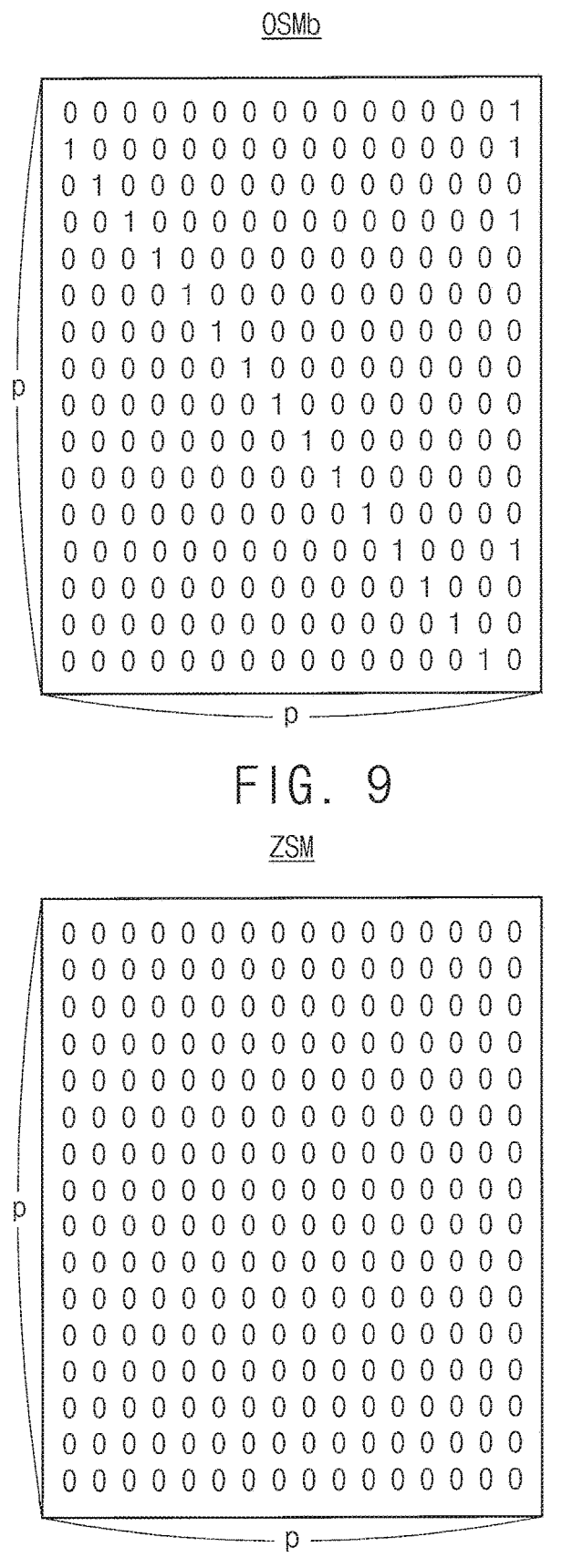

FIG. 8 illustrates an example of a base offset sub matrix that is used for generating the offset sub matrices of the first parity sub matrix of FIG. 7 according to at least one embodiment.

Referring to FIG. 8, according to some aspects, a base offset sub matrix OSMb includes (p+3) high-level elements, where p is a natural number greater than one. According to some aspects, the base offset sub matrix OSMb is obtained based on a primitive polynomial (for example, $x^{16}+x^{12}+x^3+x+1$). In some embodiments, if a p-th order primitive polynomial for the base offset sub matrix OSMb is varied, elements of each offset sub matrix of the plurality of offset sub matrices OSM1 to OSMk is varied.

According to some aspects, a first offset sub matrix OSM1 of the plurality of offset sub matrices OSM1 to OSMk is obtained based on exponentiation of the base offset sub matrix OSMb. According to some aspects, a second offset sub matrix OSM2 of the plurality of offset sub matrices OSM1 to OSMk is obtained by multiplying the first offset sub matrix OSM1 and a sub matrix obtained based on exponenation of the base offset sub matrix OSMb by an offset.

According to some aspects, a gap between two offset sub matrices OSM(2i−1) and OSM(2i) (where i has integer values from one to eight) associated with a memory chip of the offset sub matrices OSM1 to OSMk is regular. In an example, an offset sub matrix OSM4 may be obtained by multiplying an offset sub matrix OSM3 and a sub matrix obtained by exponentiation of the base offset sub matrix OSMb by an offset.

FIG. 9 illustrates an example of a zero sub matrix included in the parity generation matrix of FIG. 7 according to at least one embodiment. Referring to FIG. 9, according to some aspects, each element (e.g., value) of the zero sub matrix ZSM is a low-level element (e.g., a 0).

Figure 10:
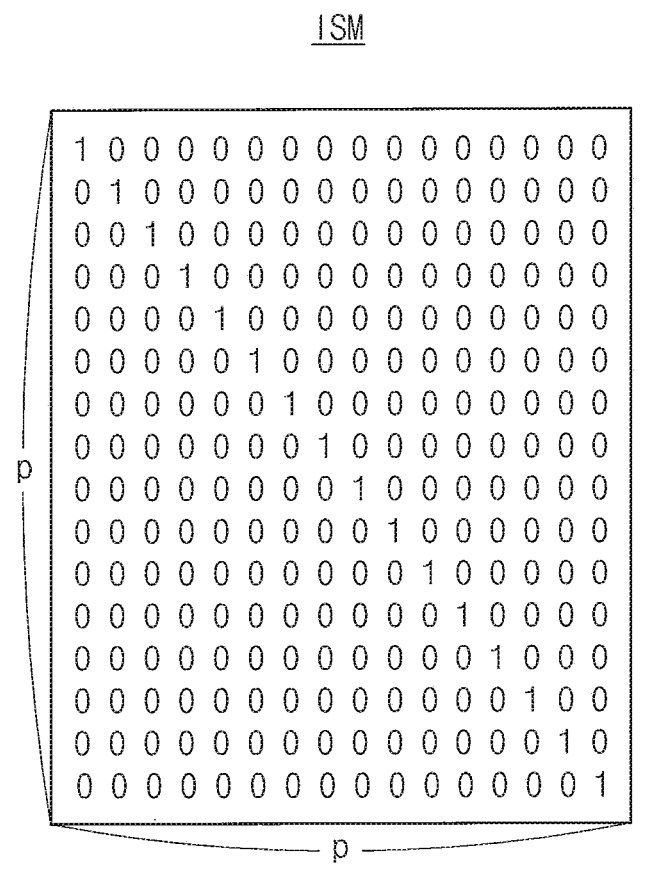

FIG. 10 illustrates an example of an identity sub matrix included in the parity generation matrix of FIG. 7 according to at least one embodiment. Referring to FIG. 10, according to some aspects, the identity sub matrix ISM includes p high-level elements disposed in a diagonal direction. In an example, a first row and a first column of the identity sub matrix include a high-level element (e.g., a 1) in a first index position, a second row and a second column of the identity sub matrix include a high-level element in a second index position, and so on. According to some aspects, each index position of the identity sub matrix ISM that does not include a high-level element includes a low-level element (e.g., a 0).

Referring to FIGS. 7 through 10, according to some aspects, p is equal to 16, and corresponds to a number of bits included in the data set DQ_BL that are input to and/or output from each data chip of the plurality of data chips 200_1 to 200_k during one burst operation as described with reference to FIG. 3. According to some aspects, a number of non-zero elements included in the first parity sub matrix $HS_{11}$ is greater than a number of non-zero elements included in the second parity sub matrix $HS_{12}$ or a number of non-zero elements included in the third parity sub matrix $HS_{13}$.

Figure 11:
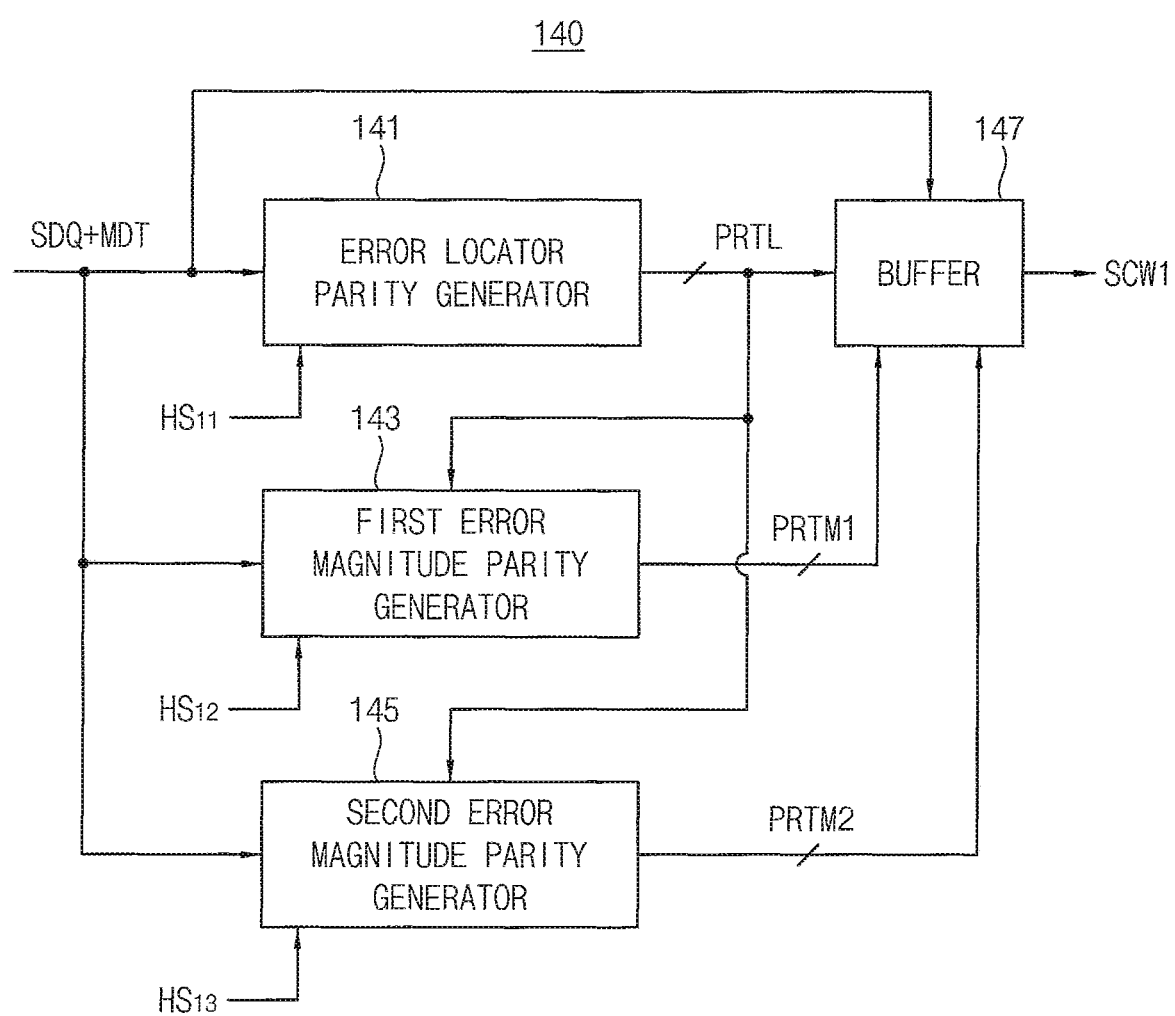
FIG. 11 illustrates an example of an ECC encoder of the ECC engine of FIG. 6 according to at least one embodiment.

FIG. 11 illustrates an example of the ECC encoder of the ECC engine of FIG. 6 according to at least one embodiment.

Referring to FIG. 11, according to some aspects, the ECC encoder 140 includes an error locator parity generator 141, a first error magnitude parity generator 143, a second error magnitude parity generator 145, and a buffer 147.

According to some aspects, the error locator parity generator 141 performs an ECC encoding on the user data set SDQ and the meta data MDT by using the first parity sub matrix $HS_{11}$ to generate the first parity data PRTL. According to some aspects, the first parity data PRTL is used for determining locations of errors. According to some aspects, the error locator parity generator 141 provides the first parity data PRTL to the buffer 147. The first parity data PRTL may be referred to as a first parity data.

According to some aspects, the error locator parity generator 141 generates first parity data PRTL by performing a matrix-multiplication operation on the user data set SDQ and the meta data MDT using the first parity sub matrix $HS_{11}$:

$$p_L = HS_{11}[ms\ O]^T \qquad (1)$$

where ms is a vector representation of the user data set SDQ and the meta data MDT, $p_L$ is a vector representation of the error locator parity data PRTL, T is a matrix transpose, and O represents a p×p zero matrix. According to some aspects, the zero matrix is a zero sub matrix ZSM as described with reference to FIG. 9.

According to some aspects, the first error magnitude parity generator 143 performs an ECC encoding on the user data set SDQ and the meta data MDT by using the second parity sub matrix $HS_{12}$ to generate the first sub parity data PRTM1. According to some aspects, the first sub parity data PRTM1 is used for determine a number of bit errors. According to some aspects, the first error magnitude parity generator 143 provides the first sub parity data PRTM1 to the buffer 147. The first sub parity data PRTM1 may be referred to as first error magnitude parity data.

According to some aspects, the first error magnitude parity generator 143 generates the first sub parity data PRTM1 by performing a matrix-multiplication operation on the user data set SDQ and the meta data MDT using the second parity sub matrix $HS_{12}$:

$$p_{M1} = HS_{12}[ms \; p_L \; O]^T \qquad (2)$$

where $p_{M1}$ is a vector representation of the first sub parity data PRTM1.

According to some aspects, the second error magnitude parity generator 145 performs an ECC encoding on the user data set SDQ and the meta data MDT by using the third parity sub matrix $HS_{13}$ to generate the second sub parity data PRTM2. According to some aspects, the second sub parity data PRTM2 is used for determining a number of bit errors. According to some aspects, the second error magnitude parity generator 145 provides the second error magnitude parity data PRTM2 to the buffer 147. The second sub parity data PRTM2 may be referred to as second error magnitude parity data.

According to some aspects, the second error magnitude parity generator 145 generates the second sub parity data PRTM2 by performing a matrix-multiplication operation on the user data set SDQ and the meta data MDT using the third parity sub matrix $HS_{13}$:

$$p_{M2} = HS_3[ms \; p_L \; O]^T \qquad (3)$$

where $p_{M2}$ is a vector representation of the second error magnitude parity data PRTM2.

According to some aspects, the first sub parity data PRTM1 and the second sub parity data PRTM2 are included in the second parity data PRTM.

According to some aspects, the buffer 147 receives the user data set SDQ, the meta data MDT, the first parity data PRTL, the first sub parity data PRTM1, and the second sub parity data PRTM2 as the first codeword set SCW1, and provides the first codeword set SCW1 including the user data set SDQ, the meta data MDT, the first parity data PRTL, the first sub parity data PRTM1, and the second sub parity data PRTM2 to the memory module MM.

Figure 12:
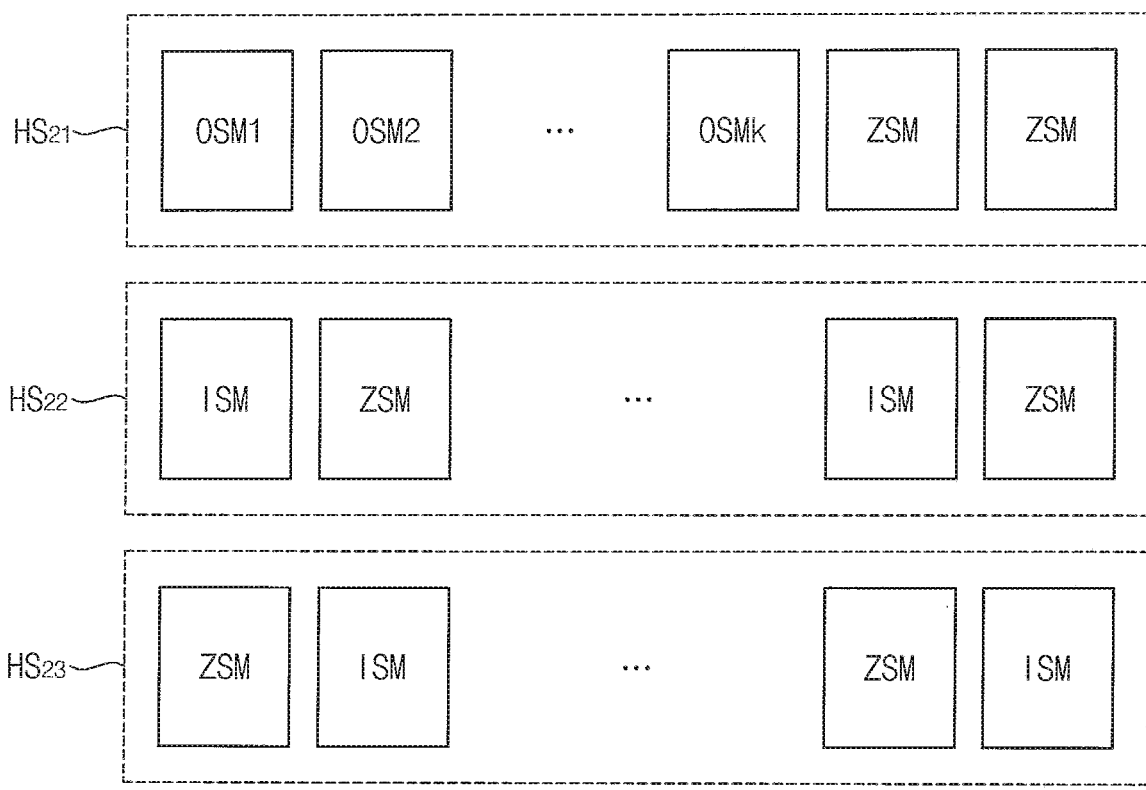
FIG. 12 illustrates an example of a parity check matrix stored in the memory of the ECC engine of FIG. 6 according to at least one embodiment.

FIG. 12 illustrates an example of a parity check matrix stored in the memory of the ECC engine of FIG. 6 according to at least one embodiment. Referring to FIG. 12, according to some aspects, the parity check matrix PCM includes a fourth parity sub matrix $HS_{21}$, a fifth parity sub matrix $HS_{22}$, and a sixth parity sub matrix $HS_{23}$.

According to some aspects, the fourth parity sub matrix $HS_{21}$ includes the plurality of offset sub matrices OSM1 to OSMk corresponding to the data chips 200_1 to 200_k described with reference to FIG. 7, the first zero sub matrix ZSM1 corresponding to the first parity chip 200pa described with reference to FIG. 7, and the second zero sub matrix ZSM2 corresponding to the second parity chip 200pb described with reference to FIG. 7. According to some aspects, the each offset sub matrix of the plurality of offset sub matrices OSM1 to OSMk, the first zero sub matrix ZSM1, and the second zero sub matrix ZSM2 includes p×p elements.

According to some aspects, each of the fifth parity sub matrix $HS_{22}$ and the sixth parity sub matrix $HS_{23}$ includes (k+1) identity sub matrices ISM and (k+1) zero sub matrices ZSM. According to some aspects, each of the (k+1) identity sub matrices ISM and the (k+1) zero sub matrices ZSM includes p×p elements. According to some aspects, the (k+1) identity sub matrices ISM and the (k+1) zero sub matrices ZSM are alternatingly arranged. In an example, in each of the fifth parity sub matrix $HS_{21}$ and the sixth parity sub matrix $HS_{31}$, an identity sub matrix ISM may be included between a proximate pair of zero sub matrices ZSM, and a zero sub matrix ZSM may be included between a proximate pair of identity sub matrices ISM.

Referring to FIGS. 7 and 12, according to some aspects, the fourth parity sub matrix $HS_{21}$ is similar to the first parity sub matrix $HS_{11}$, the fifth parity sub matrix $HS_{22}$ is similar to the second parity sub matrix $HS_{12}$, and the sixth parity sub matrix $HS_{23}$ is similar to the third sub matrix $HS_{13}$. According to some aspects, the ECC encoder 140 and the ECC decoder 150 described with reference to FIG. 6 share the parity generation matrix PGM and perform ECC encoding and ECC decoding, respectively. According to some aspects, the parity check matrix PCM is equivalent to the parity generation matrix PGM described with reference to FIGS. 6 and 7.

Figure 13:
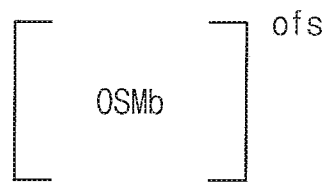
FIG. 13 illustrates an example of an offset sub matrix of FIG. 12 according to at least one embodiment.

FIG. 13 illustrates an example of an offset sub matrix OSM of FIG. 12 according to at least one embodiment. Referring to FIG. 13, according to some aspects, the offset sub matrix OSM is obtained based on exponentiation of the base offset sub matrix OSMb by an offset ofs.

Referring to FIGS. 12 and 13, according to some aspects, a number of non-zero elements included in the third parity sub matrix $HS_{21}$ may be greater than a number of non-zero elements included in the fourth parity sub matrix $HS_{22}$ or a number of non-zero elements included in the sixth parity sub matrix $HS_{23}$. Therefore, in some embodiments, the ECC decoder 150 described with reference to FIG. 6 generates a first sub syndrome and a second sub syndrome using the fifth parity sub matrix $HS_{22}$ and the sixth parity sub matrix $HS_{23}$ and generates the second syndrome by summing the first sub syndrome and the second sub syndrome.

Figure 14:
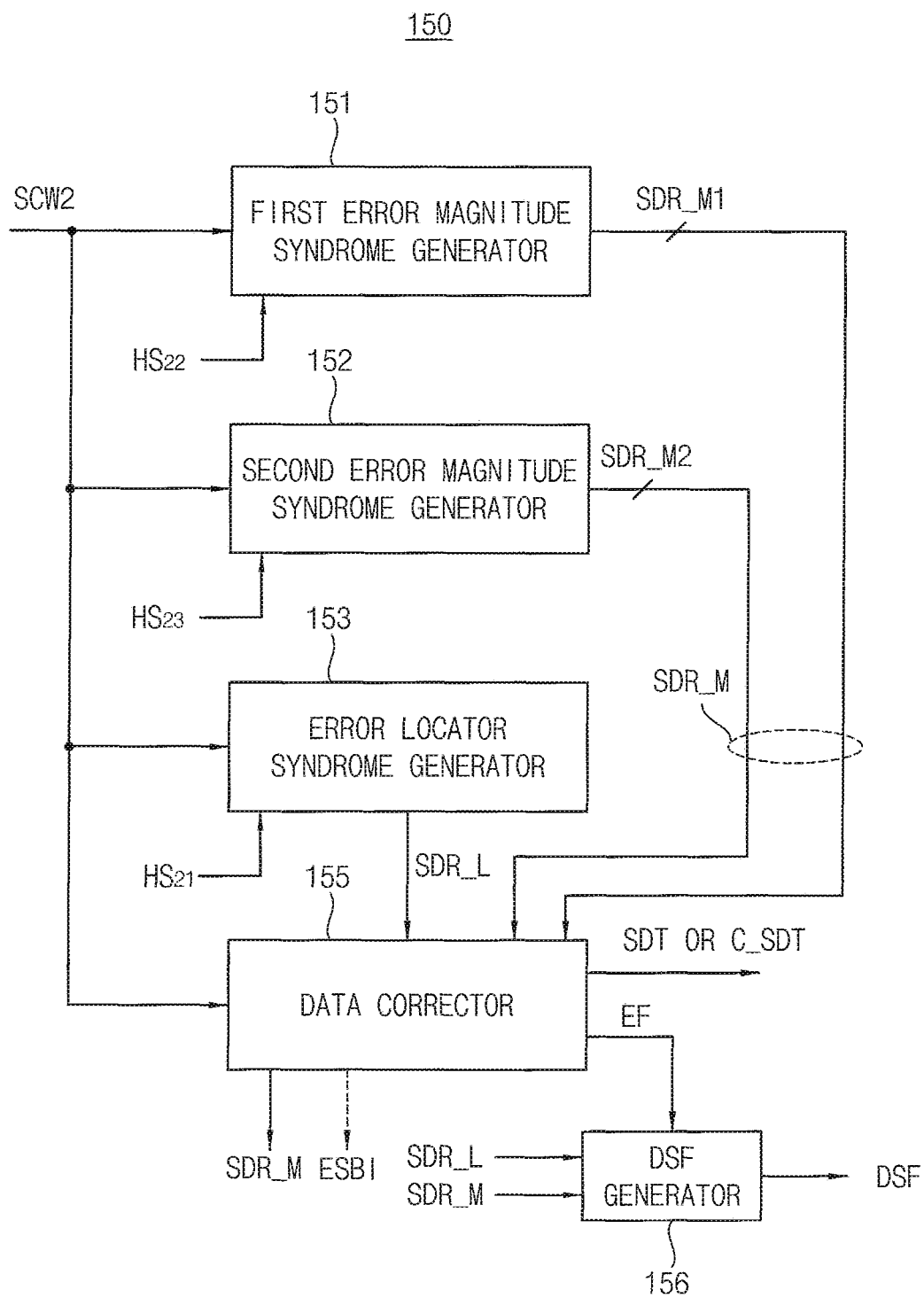
FIG. 14 illustrates an example of an ECC decoder of the ECC engine of FIG. 6 according to at least one embodiment.

FIG. 14 illustrates an example of the ECC decoder included in the ECC engine of FIG. 6 according to at least one embodiment.

Referring to FIG. 14, according to some aspects, the ECC decoder 150 includes a first error magnitude syndrome generator 151, a second error magnitude syndrome generator 152, an error locator syndrome generator 153, a data corrector 155, and a decoding status flag (DSF) generator 156.

According to some aspects, the first error magnitude syndrome generator 151 generates a first sub syndrome SDR_M1 indicating a number of error bits by performing a matrix-multiplication operation on the read codeword set SCW2 and the second parity sub matrix $HS_{22}$:

$$S_{M01} = HS_{22} r^T \qquad (4)$$

where $r^T$ is the read codeword set SCW2 and $S_{M01}$ is a vector representation of the first sub syndrome SDR_M1.

According to some aspects, the second error magnitude syndrome generator 152 generates a second sub syndrome SDR_M2 indicating a number of error bits by performing a matrix-multiplication operation on the read codeword set SCW2 and the third parity sub matrix $HS_{23}$.

$$S_{M02} = HS_{23} r^T \qquad (5)$$

where $S_{M02}$ is a vector representation of the second sub syndrome SDR_M2.

According to some aspects, the first sub syndrome SDR_M1 and the second sub syndrome SDR_M2 are included in a second syndrome SDR_M, e.g., an error magnitude syndrome.

According to some aspects, the error locator syndrome generator 153 generates a first syndrome SDR_L indicating positions of correctable errors in the second codeword set (e.g., the read codeword set) SCW2:

$$S_L = HS_{21} r^T \quad (5)$$

where $S_L$ is a vector representation of the first syndrome SDR_L.

According to some aspects, the error locator syndrome generator 153 provides the first syndrome SDR_L to the data corrector 155.

According to some aspects, the data corrector 155 corrects a correctable error bit in the user data set SDQ of the read codeword set SCW2 on a symbol basis based on the first syndrome SDR_L and the second syndrome SDR_M to output the corrected user data set C_SDQ or the user data set SDQ when the user data set SDQ includes an uncorrectable error. According to some aspects, the data corrector 155 outputs an error flag EF to the decoding status flag generator 156. According to some aspects, the error flag EF indicates whether an error bit in the user data set SDQ are corrected.

According to some aspects, the data corrector 155 provides the second syndrome SDR_M and the error symbol information ESBI associated with the correctable errors to the EMC 400 described with reference to FIG. 2 when the first syndrome SDR_L and the second syndrome SDR_M indicates that the user data set in the codeword set SCW2 includes the correctable error.

According to some aspects, the decoding status flag generator 156 generates the decoding status flag DSF indicating whether the user data set SDQ in the second codeword set SCW2 includes the correctable error or the uncorrectable error based on the first second syndrome SDR_L, the second syndrome SDR_M, and the error flag EF.

According to some aspects, a first syndrome SDR_L having zero value and a second syndrome SDR_M having zero value indicate that the user data set SDQ in the second codeword sett SCW2 includes no errors. According to some aspects, a first syndrome SDR_L having a non-zero value and a second syndrome SDR_M having a non-zero value indicate that the user data set SDQ in the second codeword SCW2 includes a correctable error on a symbol basis.

According to some aspects, a first syndrome SDR_L having zero value and a second syndrome SDR_M having a non-zero value indicate that the user data set SDQ in the second codeword SCW2 includes an uncorrectable error that cannot be corrected using the first syndrome SDR_L and the second syndrome SDR_M.

According to some aspects, when the user data set SDQ in the second codeword SCW2 includes a correctable error on a symbol basis, detected through a read operation, the EMC 400 stores the second syndrome. According to some aspects, the EMC 400 accumulates a plurality of second syndromes associated with a plurality of correctable errors. According to some aspects, the EMC 400 stores the plurality of second syndromes. According to some aspects, the EMC 400 determines an attribute of the correctable errors based on a result of counting second syndromes of the plurality of second syndromes. According to some aspects, the EMC 400 predicts an occurrence of an uncorrectable error in a memory region in which a correctable error occurs based on the plurality of second syndromes.

Figure 15:
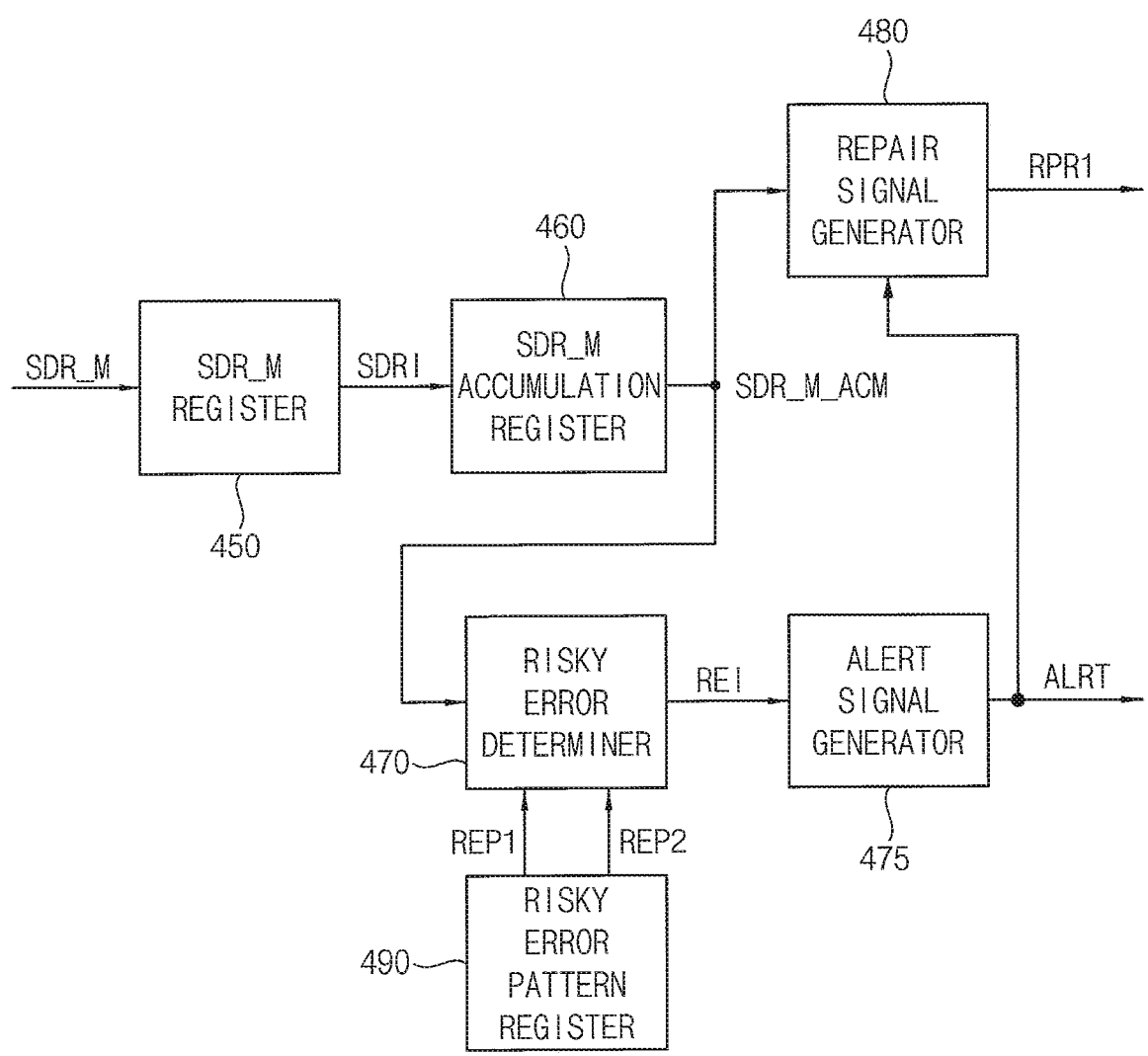
FIG. 15 is a block diagram of an error managing circuit of the memory controller of FIG. 2 according to at least one embodiment.

FIG. 15 is a block diagram illustrating an example of the error managing circuit of the memory controller of FIG. 2 according to at least one embodiment.

Referring to FIG. 15, an error managing circuit (EMC) 400a may include a syndrome register 450 (e.g., a SR_M register), a syndrome accumulation register 460 (e.g., a SDR_M accumulation register), a risky error determiner 470, an alert signal generator 475, a repair signal generator 480, and a risky error pattern register 490. According to some aspects, EMC 400a is an example of, or includes aspects of, the EMC 400 described with reference to FIG. 1.

According to some aspects, the syndrome register 450 stores a second syndrome SDR_M associated with a correctable error and obtained through a read operation as syndrome information SDRI. According to some aspects, the syndrome register 450 provides the syndrome information SDRI to the syndrome accumulation register 460.

According to some aspects, the syndrome accumulation register 460 is connected to the syndrome register 450. According to some aspects, the syndrome accumulation register 460 receives the syndrome information SDRI from the syndrome register 450 and stores the second syndrome SDR_M included in the syndrome information SDRI. According to some aspects, the syndrome accumulation register 460 accumulates a plurality of second syndromes SDR_M_ACM by repeatedly receiving syndrome information SDRI including second syndromes SDR_M of the plurality of second syndromes SDR_M_ACM from the syndrome register 450 and storing the second syndromes SDR_M as the plurality of second syndromes SDR_M_ACM. According to some aspects, the syndrome accumulation register outputs the plurality of second syndromes SDR_M_ACM.

According to some aspects, the risky error pattern register 490 stores at least one of a first error pattern set REP1 and a second error pattern set REP2 and provides the risky error determiner 470 with at least one of the first error pattern set REP1 and the second error pattern set REP2.

According to some aspects, the risky error determiner 470 is connected to the syndrome accumulation register 460. According to some aspects, the risky error determiner 470 compares a pattern included in the plurality of second syndromes SDR_M_ACM with at least one of the first error pattern set REP1 and the second error pattern set REP2. According to some aspects, the risky error determiner 470 generates risky error information REI predicting an occurrence of an uncorrectable error based on a result of the comparison. According to some aspects, the risky error determiner 470 provides the risky error information REI to the alert signal generator 475.

According to some aspects, the risky error determiner 470, determines that a result of the comparison is that a pattern of the plurality of second syndromes SDR_M_ACM matches at least one of the first error pattern set REP1 and the second error pattern set REP2. According to some aspects, the risky error determiner 470 predicts a probability of the occurrence of the uncorrectable error is greater than a reference probability in response to the determination and provides the risky error information REI indicating that the probability of the occurrence of the uncorrectable error is greater than the reference probability to the alert signal generator 475 and the repair signal generator 480.

In some embodiments, the first error pattern set REP1 is associated with input/output pads through which user data is input and output in the plurality of data chips 200_1 to 200_k described with reference to FIG. 1. In some embodiments, the second error pattern set REP2 is associated with a burst length of the user data as described with reference to FIG. 3.

According to some aspects, the first error pattern set REP1 includes first error patterns associated with the input/output pads and a first rule. According to some aspects, the second error pattern set REP2 includes second error patterns associated with the burst length and a second rule. According to some aspects, each of the first error pattern set REP1 and the second error pattern REP2 include data corresponding to a high probability of an occurrence of an uncorrectable error. According to some aspects, each of the first error pattern set REP1 and the second error pattern REP2 include a plurality of error patterns.

According to some aspects, in response to a determination that the pattern of the plurality of second syndromes SDR_M_ACM matches the first error pattern set REP1, the EMC 400a determines that an error occurs due to a fault of the input/output pads through which user data is input and output. According to some aspects, in response to a determination that the pattern of the plurality of second syndromes SDR_M_ACM matches the second error pattern set REP2, the EMC 400a determines that an error occurs due to a fault of sub word-line drivers disposed in sub array blocks included in the memory cell array 300 described with reference to FIG. 4.

According to some aspects, the alert signal generator 475 provides the alert signal ALRT indicating that the uncorrectable error occurs in the memory region based on the risky error information REI to a CPU 110 as described with reference to FIG. 2. According to some aspects, the repair signal generator 480 is connected to the syndrome accumulation register 460 and provides a first repair signal RPR1 for repairing the memory region based on the plurality of second syndromes SDR_M_ACM and the alert signal ALRT to the CPU 110.

Accordingly, in some embodiments, in response to the pattern of the plurality of second syndromes SDR_M_ACM corresponding to a risky error pattern that matches at least one of the first error pattern set REP1 and the second error pattern set REP2, the EMC 400a predicts that the probability of the occurrence of the uncorrectable error is greater than a reference probability and provides the alert signal ALRT associated with the risky error pattern to the CPU 110 in response to the prediction.

According to some aspects, the CPU 110 performs a post package repair on the memory region in which the uncorrectable error occurs based on the alert signal ALRT and the first repair signal RPR1. According to some aspects, the CPU 110 inhibits a use of the memory region in which the uncorrectable error occurs based on the alert signal ALRT and the first repair signal RPR1.

According to some aspects, the EMC 400a stores the second syndrome SDR_M associated with the correctable error and obtained through a read operation, accumulates the second syndromes SDR_M associated with the correctable errors and obtained through the plurality of read operations as the plurality of second syndromes SDR_M_ACM by storing the second syndromes SDR_M, generates the risky error information REI predicting the occurrence of the uncorrectable error based on comparing the plurality of second syndromes SDR_M_ACM with at least one error pattern set (e.g., the first error pattern set REP1 or the second error pattern set REP2), provides the alert signal ALRT to the CPU 110 based on the risk error information REI, and provides the first repair signal RPR1 for repairing the memory region based on the plurality of second syndromes SDR_M_ACM and the alert signal ALRT to the CPU 110.

Figure 16:
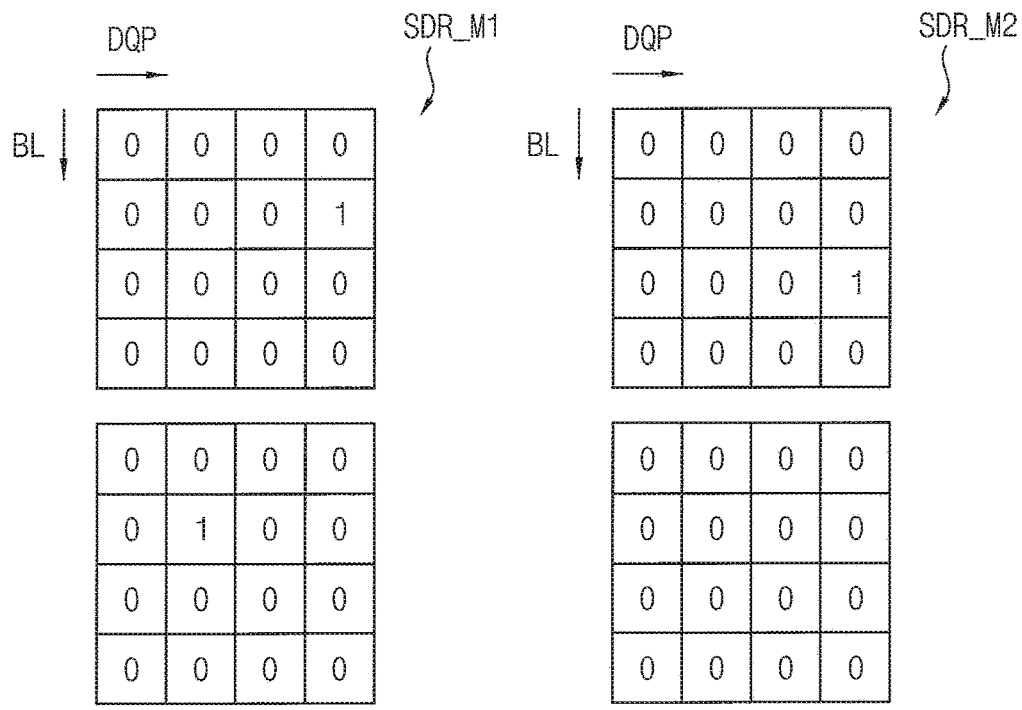
FIG. 16 illustrates an example of a syndrome register of the error managing circuit of FIG. 15 according to at least one embodiment.

FIG. 16 illustrates an example of the syndrome register of the error managing circuit of FIG. 15 according to at least one embodiment. Syndrome register 450a is an example of, or includes aspects of, the syndrome register 450 described with reference to FIG. 15.

Referring to FIG. 16, according to some aspects, a syndrome register 450a temporarily stores a first sub syndrome SDR_M1 and a second sub syndrome SDR_M2 associated with a correctable error detected through a read operation. According to some aspects, the correctable error is detected during the read operation. According to some aspects, the syndrome register 450a stores the first sub syndrome SDR_M1 and the second sub syndrome SDR_M2 associated with correctable errors detected through each of a plurality of current read operations.

According to some aspects, the data corrector 155 of the ECC decoder 150 described with reference to FIG. 14 stores a second syndrome SDR_M in the EMC 400 described with reference to FIG. 1 when the correctable error that is correctable on a symbol basis occurs in the user data set SDQ. According to some aspects, the first sub syndrome SDR_M1 and the second sub syndrome SDR_M2 stored in the syndrome register 450a each represent a symbols included in the user data set SDQ. According to some aspects, the first sub syndrome SDR_M1 and the second sub syndrome SDR_M2 are arranged along a data input/output (I/O) pad direction DQP and a burst length direction BL in the syndrome register 450a. According to some aspects, the burst length direction BL is orthogonal to the direct input/output pad direction DQP.

Figure 17:
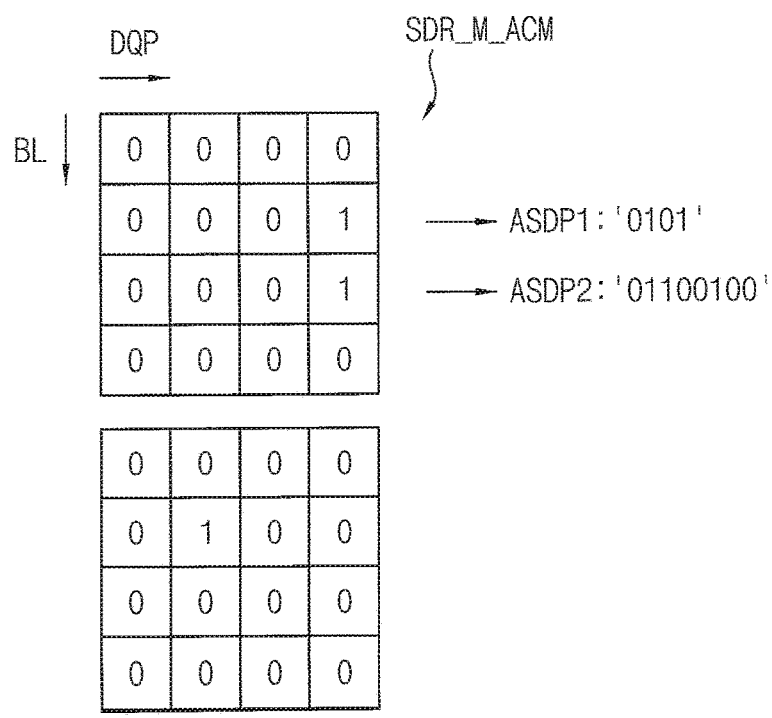
FIG. 17 illustrates an example of a syndrome accumulation register of the error managing circuit of FIG. 15 according to at least one embodiment.

FIG. 17 illustrates an example of the syndrome accumulation register of the EMC of FIG. 15 according to at least one embodiment. Syndrome accumulation register 460a is an example of, or includes aspects of, the syndrome accumulation register 460 described with reference to FIG. 15.

Referring to FIG. 17, according to some aspects, a syndrome accumulation register 460a accumulates second syndromes associated with correctable errors and obtained through a plurality of read operations to obtain a plurality of second syndromes SDR_M_ACM. According to some aspects, the syndrome accumulation register 460a stores the plurality of second syndromes SDR_M_ACM therein. In an example, the syndrome accumulation register 460a stores the second syndromes by arranging the second syndromes along the data I/O pad DQP direction and the burst length BL direction in memory of the syndrome accumulation register 460a and accumulates the stored second syndromes as the plurality of second syndromes SDR_M_ACM.

According to some aspects, the risky error determiner 470 determines a possibility of an occurrence of an uncorrectable error by comparing a pattern of the plurality of second syndromes SDR_M_ACM in the data I/O pad DQP direction with the first error pattern set REP1 and by comparing a pattern of the plurality of second syndromes SDR_M_ACM in the burst length BL direction with the second error pattern set REP2.

In an example illustrated by FIG. 17, a pattern ASDP1 in the data I/O pad DQP direction corresponds to '0101' and a pattern ASDP2 in the burst length BL direction corresponds to '01100100'. In the example, correctable errors occur repeatedly in a specific burst length BL direction based on the pattern ASDP2 corresponding to '01100100'. Accordingly, in the example, the correctable errors are associated with a sub word-line driver.

According to some aspects, the first error pattern set REP1 corresponds to a high probability of the occurrence of the uncorrectable error and includes a plurality of first error patterns in the data I/O pad DQP direction. According to some aspects, the second error pattern set REP2 corresponds to a high probability of the occurrence of the uncorrectable error and includes a plurality of second error patterns in the burst length BL direction.

Figure 18:
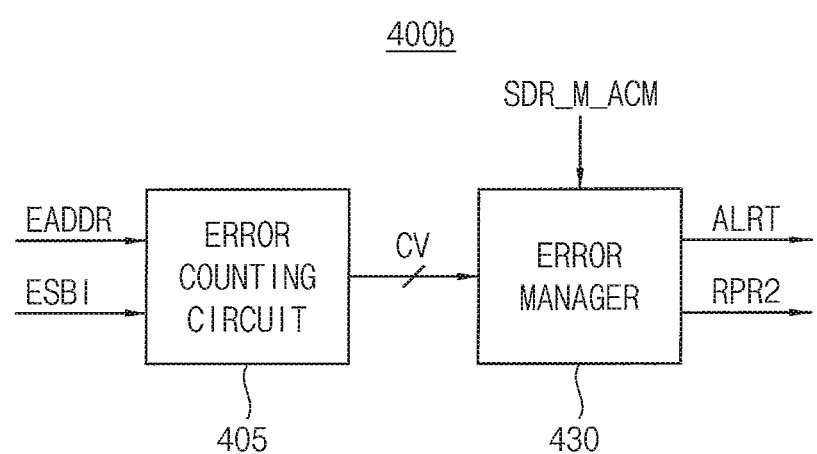
FIG. 18 is a block diagram of an error managing circuit of the memory controller of FIG. 2 according to at least one embodiment.

FIG. 18 is a block diagram of an example of an error managing circuit included in the memory controller of FIG. 2 according to at least one embodiment.

Referring to FIG. 18, according to some aspects, an error managing circuit (EMC) 400b includes an error counting circuit 405 and an error manager 430. EMC 400b is an example of, or includes aspects of, the EMC 400 described with reference to FIG. 1.

According to some aspects, the error counting circuit 405 counts the error addresses EADDR based on the error symbol information ESBI indicating a symbol in which the correctable error occurs. According to some aspects, the error counting circuit 405 outputs a counted value CV based on the counting.

According to some aspects, the error manager 430 receives the counted value CV and the plurality of second syndromes SDR_M_ACM. According to some aspects, the error manager 430 determines a first attribute (e.g., an attribute corresponding to a physical location in which the correctable error occurs) of the correctable error based on the counted value CV. According to some aspects, the error manager 430 generates a second repair signal RPR2 for repairing the memory region based on the first attribute and the plurality of second syndromes SDR_M_ACM. According to some aspects, the error manager 430 predicts the occurrence of the uncorrectable error in the memory region based on the plurality of accumulated second syndromes SDR_M_ACM. According to some aspects, the error manager 430 provides an alert signal ALRT to the CPU 110 described with reference to FIG. 1 based on the prediction. According to some aspects, the error manager 430 provides the second repair signal RPR2 to the CPU 110, and the CPU 110 provides an address to be repaired and a command designating a repair operation to the memory module MM described with reference to FIG. 1 in response to the second repair signal RPR2.

Figure 19:
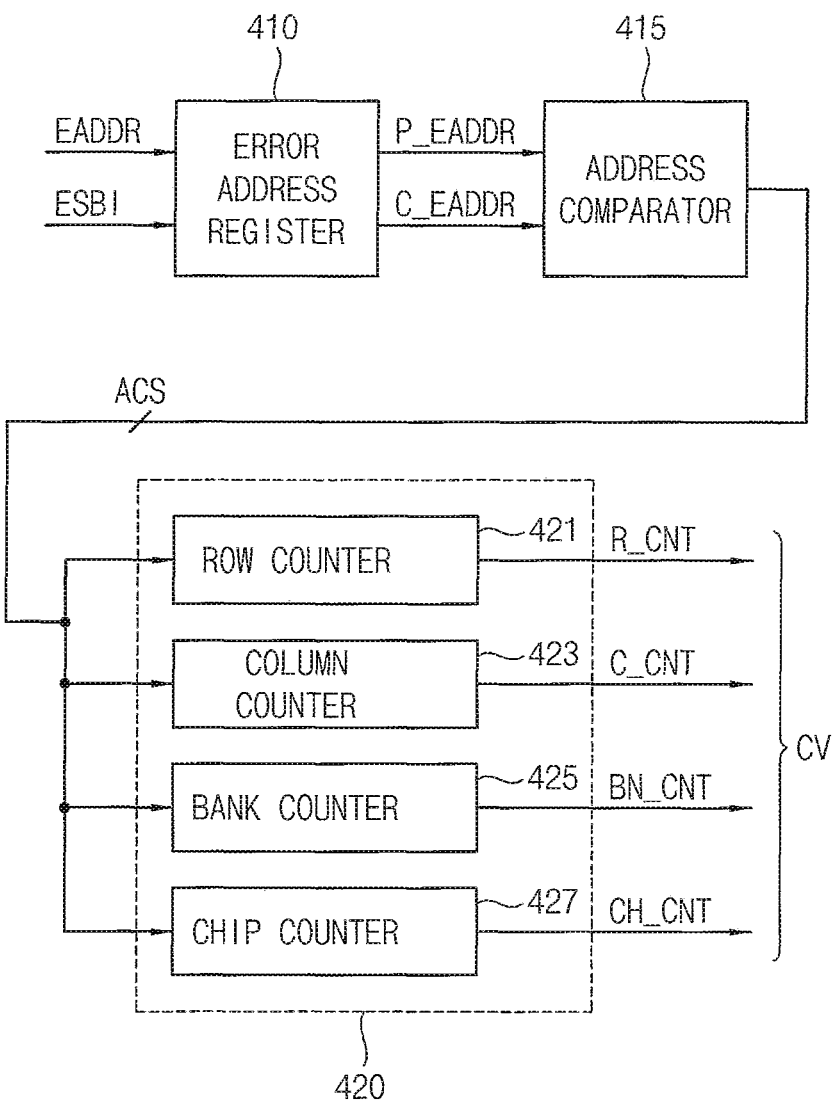
FIG. 19 is a block diagram illustrating an example of an error counting circuit of the error managing circuit of FIG. 18 according to at least one embodiment.

FIG. 19 is a block diagram of an example of an error counting circuit included in the error managing circuit of FIG. 18 according to at least one embodiment.

Referring to FIG. 19, according to some aspects, the error counting circuit 405 includes an error address register 410, an address comparator 415, and a counter circuit 420.

According to some aspects, the error address register 410 stores the error addresses EADDR and the error symbol information ESBI. According to some aspects, the address comparator 415 is connected to the error address register 410. According to some aspects, the address comparator 415 compares a previous error address P_EADDR including error symbol information associated with a previous read operation among the plurality of read operations and a current error address C_EADDR including error symbol information associated with a current read operation and outputs an address comparison signal ACS indicating a result of the comparison.

According to some aspects, the counter circuit 420 receives the address comparison signal ACS and outputs the counted value CV based on a plurality of bits included in the address comparison signal ACS. According to some aspects, the counter circuit 420 includes a first counter (e.g., a row counter) 421, a second counter (e.g., a column counter) 423, a third counter (e.g., a bank counter) 425, and a fourth counter (e.g., a chip counter) 427.

According to some aspects, the first counter 421 outputs a first sub counted value R_CNT associated with a row address of the memory region based on the address comparison signal ACS. According to some aspects, the second counter 423 outputs a second sub counted value C_CNT associated with a column address of the memory region based on the address comparison signal ACS. According to some aspects, the third counter 425 outputs a third sub counted value BN_CNT associated with a bank address of the memory region based on the address comparison signal ACS. According to some aspects, the fourth counter 427 outputs a fourth sub counted value CH_CNT associated with a memory chip including the memory region based on the address comparison signal ACS.

According to some aspects, the counted value CV includes the first sub counted value R_CNT, the second sub counted value C_CNT, the third sub counted value BN_CNT, and the fourth sub counted value CH_CNT. According to some aspects, the error manager 430 determines a physical attribute of the memory region based on a change of each of the first sub counted value R_CNT, the second sub counted value C_CNT, the third sub counted value BN_CNT, and the fourth sub counted value CH_CNT.

FIG. 20 illustrates an example of the counted value of FIG. 19 according to at least one embodiment.

In the example illustrated by FIG. 20, two correctable errors are detected in the user data set SDQ through two read operations performed on the codeword set SCW in FIG. 3, and row addresses are different in the error address EADDR associated with the two correctable errors. As the row addresses are different in the error address EADDR associated with the two correctable errors, the first sub counted value R_CNT is incremented by one.

FIG. 21 illustrates an example of the error address register of FIG. 19 according to at least one embodiment.

Referring to FIG. 21, according to some aspects, the error address register 410 is configured as a table. In an example illustrated by FIG. 21, indices Idx11 and Idx12 store error address information EAI associated with the correctable errors and the error symbol information ESBI.

In the example, the error address register 410 includes a first column 411 and a second column 413. The first column 411 stores bank address/row address/column addresses BA/RA/CA_11 and BA/RA/CA_12 of the memory region in which the correctable errors occur as the error address information EAI. The second column 413 stores a chip identifier CID1 of a data chip including the memory region in which the correctable errors occur as the error symbol information ESBI.

Figure 22:
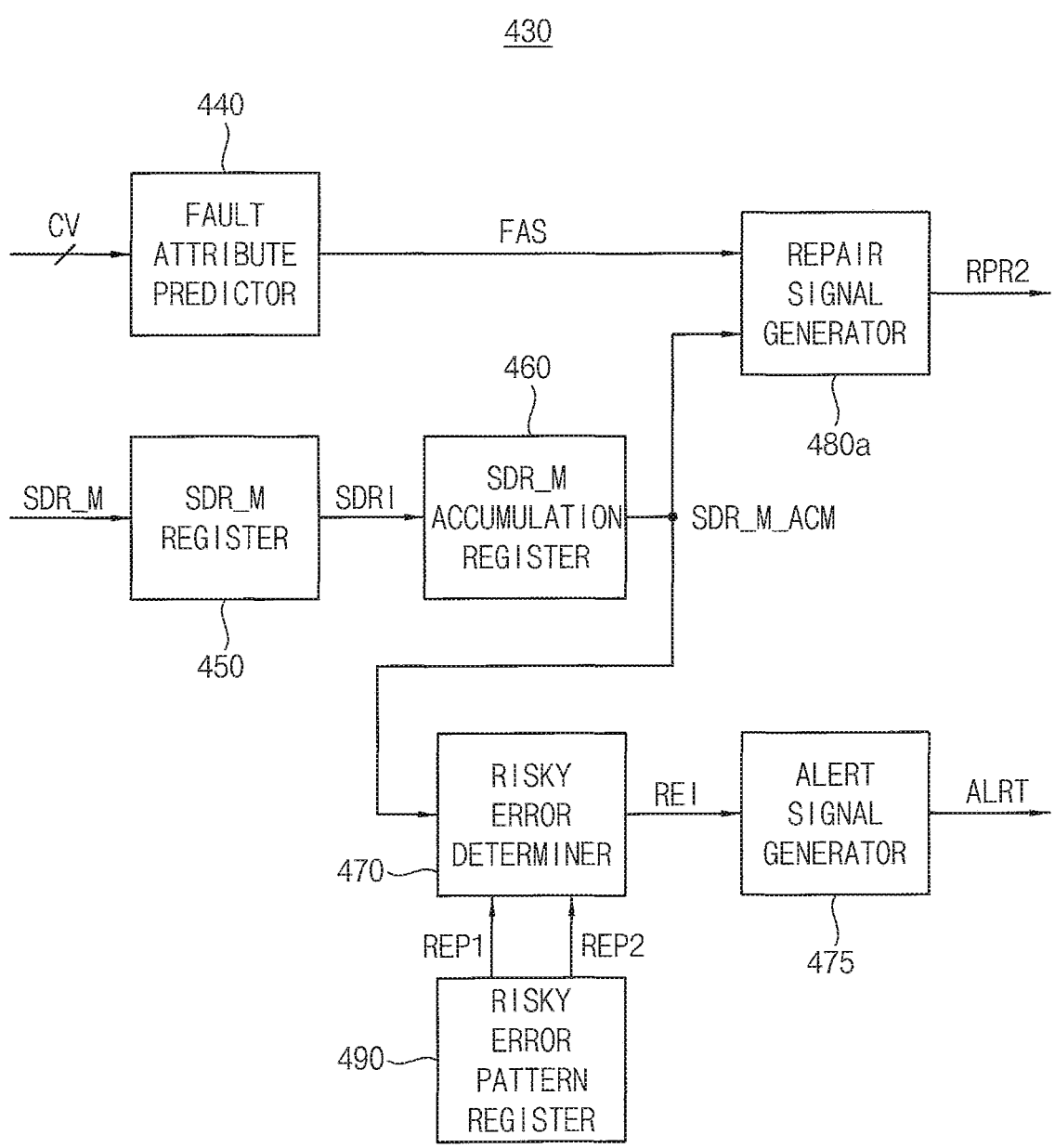
FIG. 22 is a block diagram illustrating an example of an error manager of the error managing circuit of FIG. 18 according to at least one embodiment.

According to some aspects, the error address information EAI and the error symbol information ESBI stored in the first index Idx11 is provided to the address comparator 415 as the previous error address P_EADDR, and the error address information EAI and the error symbol information ESBI stored in the second index Idx12 is provided to the address comparator 415 as the current error address C_EADDR, FIG. 22 is a block diagram of an example of an error manager included in the error managing circuit of FIG. 18 according to at least one embodiment.

Referring to FIG. 22, according to some aspects, the error manager 430 includes a fault attribute predictor 440, a syndrome register (e.g., a SDR_M register) 450, a syndrome accumulation register (e.g., a SDR_M accumulation register) 460, a risky error determiner 470, an alert signal generator 475, a repair signal generator 480a, and a risky error pattern register 490.

According to some aspects, the fault attribute predictor 440 determines the first attribute of the correctable errors based on the counted value CV and generates a fault attribute signal FAS indicating the first attribute based on the determination. According to some aspects, the syndrome register 450 stores the second syndrome SDR_M associated with the correctable error and obtained through a read operation.

According to some aspects, the syndrome accumulation register 460 is connected to the syndrome register 450 and stores second syndromes SDR_M associated with correctable errors obtained through a plurality of read operations by accumulating the second syndromes SDR_M to obtain a plurality of second syndromes SDR_M_ACM (e.g., an accumulated second syndrome SDR_M_ACM).

According to some aspects, the risky error pattern register 490 stores at least error pattern set including a first error pattern set REP1 and a second error pattern set REP2 and provides the risky error determiner 470 with the at least error pattern set including the first error pattern set REP1 and the second error pattern set REP2.

According to some aspects, the risky error determiner 470 is connected to the syndrome accumulation register 460 and compares a pattern of the accumulated second syndrome SDR_M_ACM with the at least one error pattern set, generates risky error information REI predicting occurrence of the uncorrectable error based on a result of the comparison, and provides the risky error information REI to the alert signal generator 475. According to some aspects, in response to a pattern of the accumulated second syndrome SDR_M_ACM matching at least one of the first error pattern set REP1 and the second error pattern set REP2, the risky error determiner 470 predicts a that a probability of the occurrence of the uncorrectable error is greater than a reference probability and provides the risky error information REI indicating that the probability of the occurrence of the uncorrectable error is greater than the reference probability to the alert signal generator 475 and the repair signal generator 480a.

According to some aspects, the alert signal generator 475 provides the alert signal ALRT indicating that the uncorrectable error occurs in the memory region based on the risky error information REI to the CPU 110 described with reference to FIG. 1 with. According to some aspects, the repair signal generator 480a is connected to the fault attribute predictor 440 and to the syndrome accumulation register 460 and provides a repair signal RPR2 for repairing the memory region based on the fault attribute signal FAS and the accumulated second syndrome SDR_M_ACM to the CPU 110.

Figure 23:
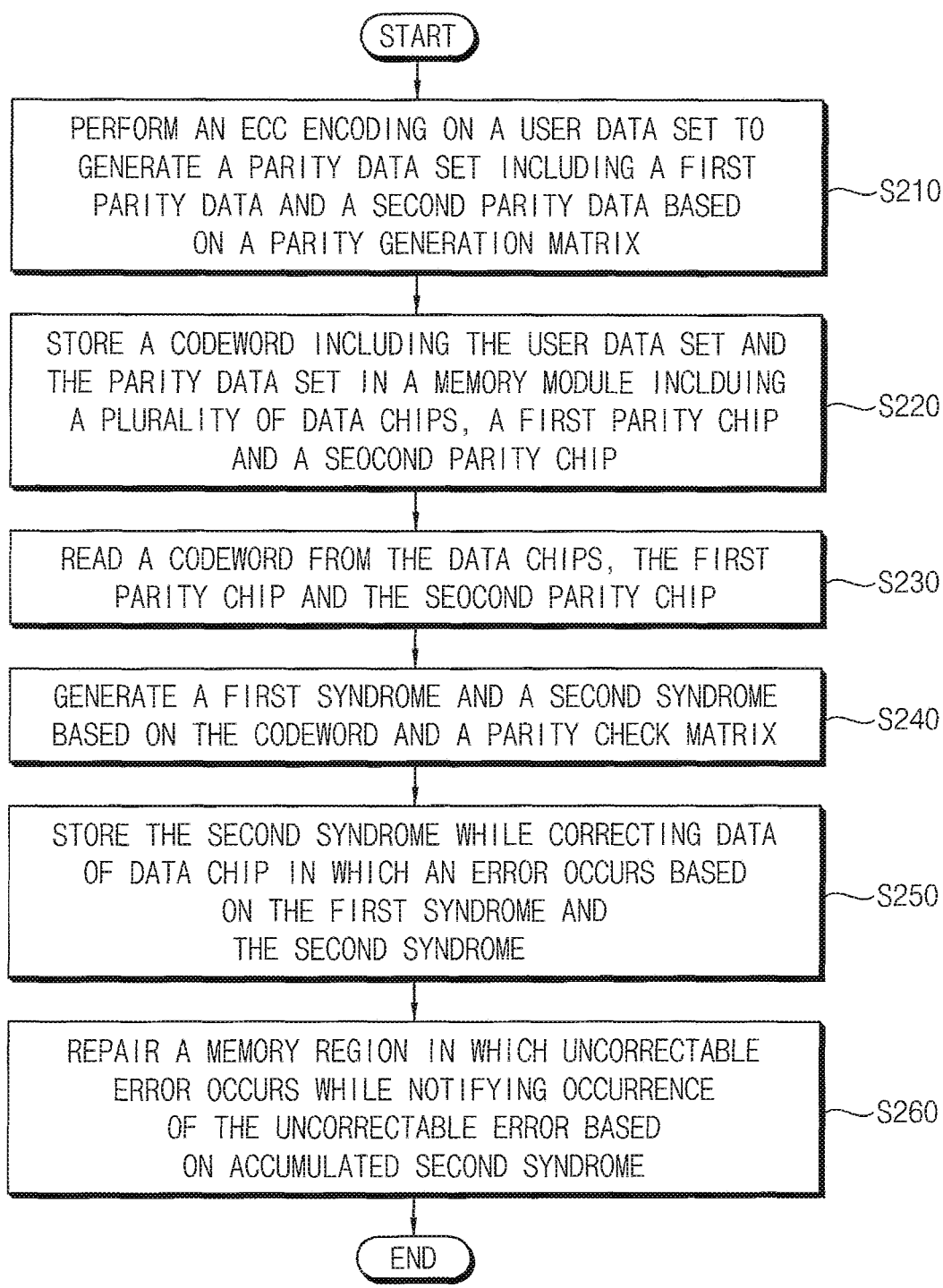
FIG. 23 is a flow chart illustrating a method of operating a memory system according to at least one embodiment.

FIG. 23 is a flow chart illustrating a process for operating a memory system according to at least one embodiment.

Referring to FIGS. 1-17 and 23, a process for operating a memory system 20 including a memory module MM including a plurality of data chips, a first parity chip, a second parity chip, and a memory controller 100 that controls the memory module MM is provided. In operation S210, an ECC encoder 140 of an ECC engine 130 included in the memory controller 100 performs an ECC encoding on a user data set SDQ and a meta data MDT based on a parity generation matrix PGM to generate a parity data set SPRT including a first parity data PRTL and a second parity data PRTM.

In operation S220, the memory controller 100 stores a codeword set SCW1 including the user data set SDQ, the meta data MDT, and the parity data set SPRT in the plurality of data chips 200_1 to 200_k, the first parity chip 200pa, and the second parity chip 200pb.

In operation S230, the memory controller 100 reads a codeword set SW2 including the user data set SDQ, the meta data MDT, and the parity data set SPRT from the memory module MM.

In operation S240, an ECC decoder 150 of the ECC engine 130 generates a first syndrome SDR_L and a second syndrome SDR_M associated with correctable errors based on the read codeword set SCW2 and the parity check matrix PCM.

In operation S250, the ECC decoder 150 stores the second syndrome SDR_M in an error managing circuit (EMC) 400 while correcting the correctable errors on a symbol basis based on the first syndrome SDR_L and the second syndrome SDR_M. In some embodiments, the EMC 400 stores second syndromes SDR_M associated with correctable errors obtained through a plurality of read operations by accumulating the second syndromes as an accumulated second syndrome (e.g., a plurality of second syndromes) SDR_M_ACM, predicts an occurrence of an uncorrectable error based on the accumulated second syndrome SDR_M_ACM, and generates a repair signal RPR1 for repairing a memory region associated with the correctable errors, and provides the repair signal RPR1 to the CPU 110.

In operation S260, the CPU 110 repairs a memory region in which the uncorrectable error occurs while notifying an occurrence of the uncorrectable error based on the accumulated second syndrome SDR_M_ACM.

Therefore, according to the process, the EMC 400 counts error addresses associated with correctable errors, stores second syndromes associated with the correctable errors by accumulating the second syndromes as a plurality of second syndromes, predicts an occurrence of an uncorrectable error in at least one memory region associated with the correctable errors of the plurality of data chips based on the plurality of second syndromes (e.g., the accumulated second syndrome), and determines an error management policy for the at least one memory region.

Figure 24:
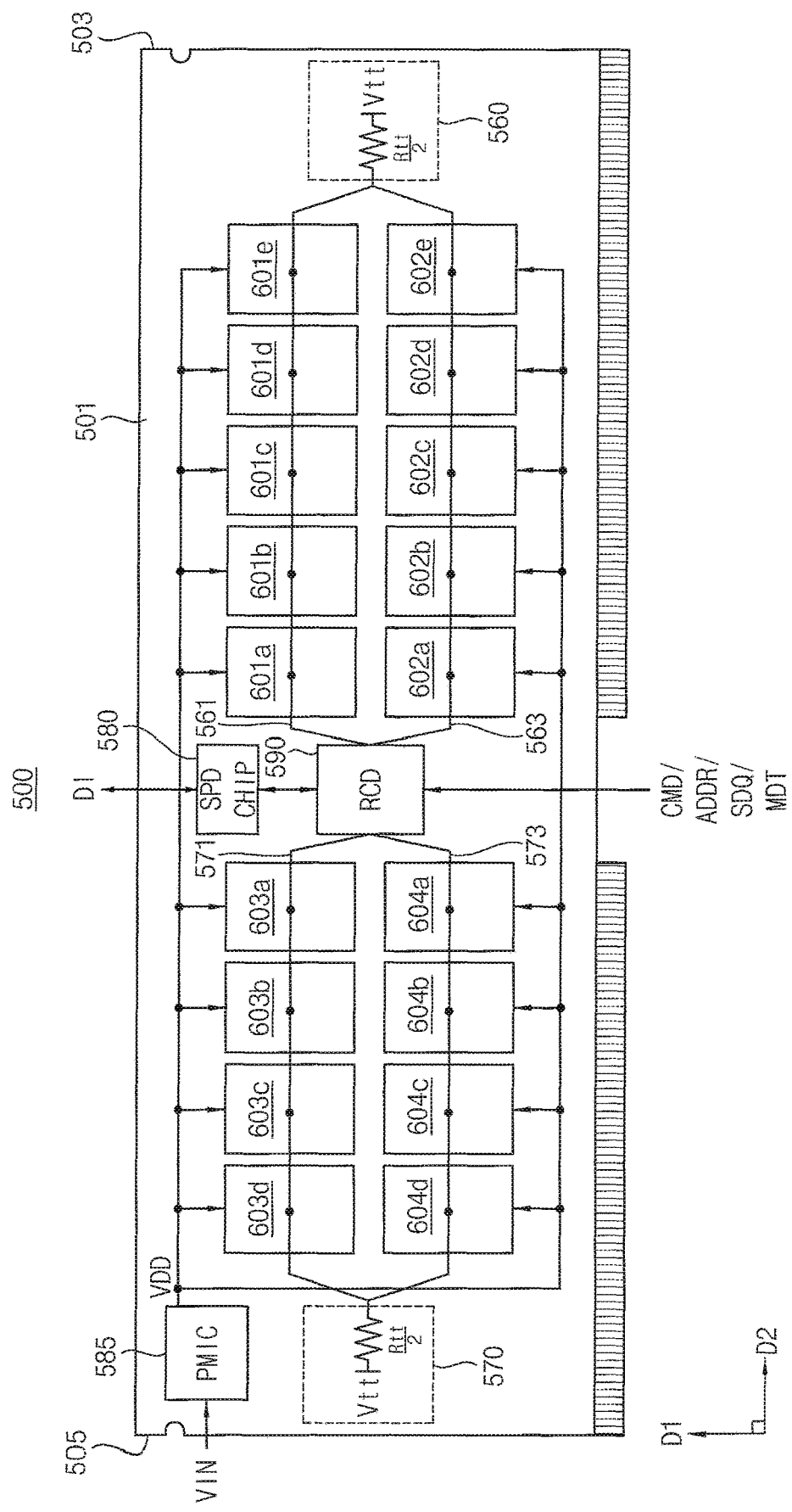
FIG. 24 is a block diagram of a memory module employed by a memory system according to at least one embodiment.

FIG. 24 is a block diagram of a memory module that may be employed by the memory system of FIG. 1 according to at least one embodiment. The memory module 500 is an example of, or includes aspects of, the memory module MM described with reference to FIG. 1.

Referring to FIG. 24, according to some aspects, a memory module 500 includes a registered clock driver (RCD) 590 disposed in or mounted on a circuit board 501, a plurality of semiconductor memory devices 601a to 601e, 602a to 602e, 603a to 603d, and 604a to 604d, module resistance units 560 and 570, a serial present detect (SPD) chip 580, and a power management integrated circuit (PMIC) 585. The RCD 590 may be referred to as a buffer chip 590.

According to some aspects, the buffer chip 590 controls the semiconductor memory devices 601a to 601e, 602a to 602e, 603a to 603d, and 604a to 604d, and the PMIC 585 under control of the memory controller 100 described with reference to FIG. 1. In an example, the buffer chip 590 receives an address ADDR, a command CMD, a user data set SDQ, and meta data MDT from the memory controller 100.

According to some aspects, the SPD chip 580 is a programmable read only memory (PROM) (e.g., an electrically erasable PROM (EEPROM)). According to some aspects, the SPD chip 580 includes initial information and/or device information DI of the memory module 500. In some embodiments, the SPD chip 580 includes initial information and/or device information DI such as a module form, a module configuration, a storage capacity, a module type, an execution environment, and the like of the memory module 500.

According to some aspects, when a memory system including the memory module 500 is booted up, the memory controller 100 reads the device information DI from the SPD chip 580 and recognizes the memory module 500 based on the device information DI. According to some aspects, the memory controller 100 controls the memory module 500 based on the device information DI from the SPD chip 580. In an example, the memory controller 100 recognizes a type of the semiconductor memory devices included in the memory module 500 based on the device information DI from the SPD chip 580.

As illustrated in the example of FIG. 24, the circuit board 501 is a printed circuit board that extends in a second direction D2 perpendicular to a first direction D1 between a first edge portion 503 and a second edge portion 505. The first edge portion 503 and the second edge portion 505 extend in the first direction D1.

According to some aspects, the buffer chip 590 is disposed on a center of the circuit board 501. According to some aspects, the plurality of semiconductor memory devices 601a to 601e, 602a to 602e, 603a to 603d, and 604a to 604d are arranged in a plurality of rows between the buffer chip 590 and the first edge portion 503, and between the buffer chip 590 and the second edge portion 505. In some embodiments, operations described herein as being performed by the buffer chip 590 are performed by processing circuitry.

According to some aspects, the semiconductor memory devices 601a to 601e and 602a to 602e are arranged along rows between the buffer chip 590 and the first edge portion 503, the semiconductor memory devices 603a to 603d and 604a to 604d are arranged along rows between the buffer chip 590 and the second edge portion 505, the semiconductor memory devices 601a to 601d, 602a to 602d, 603a to 603d, and 604a to 604d are referred to as data chips, and the semiconductor memory devices 601e and 602e are referred to as first and second parity chips, respectively.

According to some aspects, the buffer chip 590 generates first parity data and second parity data based on the user data set SDQ and the meta data MDT, stores the user data set SDQ and the meta data MDT in a data chip, stores the first parity data in the first parity chip, and store the second parity data in the second parity chip.

According to some aspects, the buffer chip 590 provides a first command/address signal to the semiconductor memory devices 601a to 601e through a first command/address transmission line 561 and provides a second command/address signal to the semiconductor memory devices 602a to 602e through a second command/address transmission line 563. According to some aspects, the buffer chip 590 provides a third command/address signal to the semiconductor memory devices 603a to 603d through a third command/address transmission line 571 and provides a fourth command/address signal to the semiconductor memory devices 604a to 604d through a fourth command/address transmission line 573.

According to some aspects, the first and second command/address transmission lines 561 and 563 are connected in common to a first module resistance unit 560 disposed adjacent to the first edge portion 503, and the third and fourth command/address transmission lines 571 and 573 are connected in common to a second module resistance unit 570 disposed adjacent to the second edge portion 505. According to some aspects, each of the module resistance units 560 and 570 include a termination resistor Rtt/2 connected to a termination voltage Vtt.

According to some aspects, each of the semiconductor memory devices 601a to 601e, 602a to 602e, 603a to 603d, and 604a to 604d is a DRAM device.

According to some aspects, the SPD chip 580 is disposed adjacent to the buffer chip 590 and the PMIC 585 is disposed between the semiconductor memory device 603d and the second edge portion 505. According to some aspects, the PMIC 585 generates a power supply voltage VDD based on an input voltage VIN and provides the power supply voltage VDD to the semiconductor memory devices 601a to 601e, 602a to 602e, 603a to 603d, and 604a to 604d.

Figure 25:
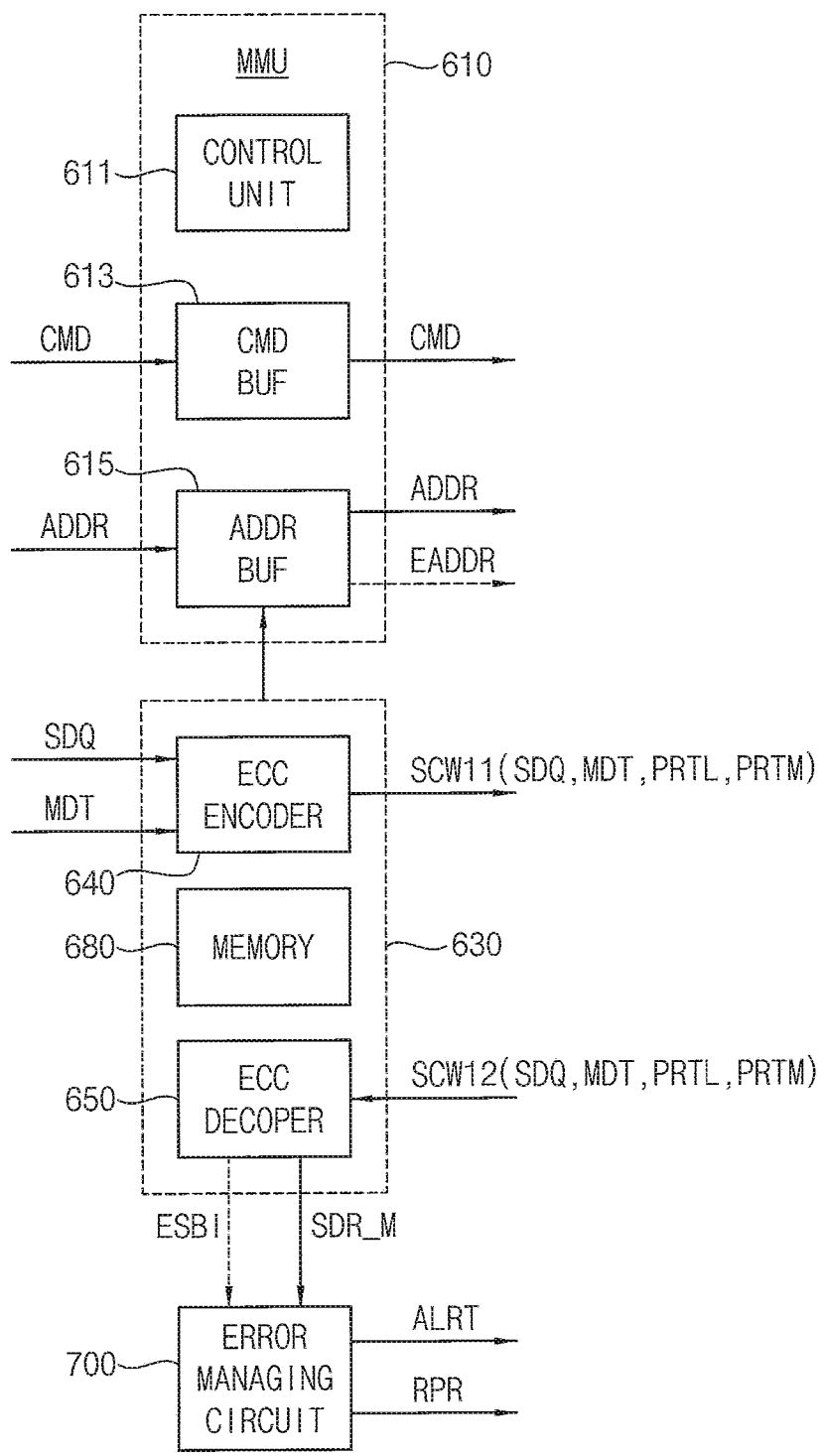
FIG. 25 is a block diagram of an example of a buffer chip of the memory module of FIG. 24 according to at least one embodiment.

FIG. 25 is a block diagram of an example of the buffer chip included in the memory module of FIG. 24 according to at least one embodiment.

Referring to FIG. 25, according to some aspects, the buffer chip 590 includes a memory management unit (MMU) 610, an ECC engine 630, and an error managing circuit (EMC) 700. The EMC 700 is an example of, or includes aspects of, the EMC 400 described with reference to FIG. 1.

According to some aspects, the MMU 610 repeats the command CMD and the address ADDR from the memory controller 100 to the semiconductor memory devices 601a to 601e, 602a to 602e, 603a to 603d, and 604a to 604d. According to some aspects, the MMU 610 includes a control unit 611, a command buffer (CMF BUF) 613, and an address buffer (ADDR BUF) 615. According to some aspects, the control unit 611 controls the command buffer 613 and the address buffer 615 to control buffering timing of the command CMD and the address ADDR. According to some aspects, the address buffer 615 provides an address associated with correctable errors as an error address EADDR to the EMC 700 under control of the control unit 611.

According to some aspects, the ECC engine 630 includes an ECC encoder 640, an ECC decoder 650, and a memory 680. According to some aspects, the ECC encoder 640 performs an ECC encoding on the user data set SDQ and the meta data MDT using a parity generation matrix to generate a codeword set SCW11 including the data set SDQ, the meta data MDT, a first parity data PRTL and a second parity data PRTM in a write operation.

According to some aspects, the ECC decoder 650 performs an ECC decoding on a codeword set SCW12 including the user data set SDQ, the meta data MDT, the first parity data PRTL, and the second parity data PRTM using a parity check matrix to generate a first syndrome and a second syndrome. According to some aspects, the ECC decoder 650 corrects a correctable error in the user data set SDQ included in the codeword set SCW12 on a symbol basis based on the first syndrome and the second syndrome and provides a corrected user data set to the memory controller 100. According to some aspects, the ECC decoder 650 provides a second syndrome SDR_M associated with the correctable errors to the EMC 700. According to some aspects, the ECC decoder 650 provides error symbol information SBI associated with a symbol in which the correctable error occurs to the EMC 700.

According to some aspects, the memory 680 stores the parity generation matrix and the parity check matrix. According to some aspects, the ECC engine 630 is implemented as the ECC engine 130 of FIG. 6.

According to some aspects, the EMC 700 stores second syndromes SDR_M associated with the plurality of correctable errors and obtained through a plurality of read operations on the memory module 500 and accumulates the second syndromes SDR_M as a plurality of second syndromes. According to some aspects, the EMC 700 predicts an occurrence of an uncorrectable error in at least one memory region of the plurality of data chips associated with the correctable errors based on the plurality of second syndromes, and determines an error management policy for the at least one memory region. According to some aspects, the EMC 700 provides an alert signal ALRT notifying a possibility of occurrence of uncorrectable errors based on the prediction to the MMU 610. According to some aspects, the EMC 700 generates a repair signal RPR for repairing the at least one memory region.

Figure 26:
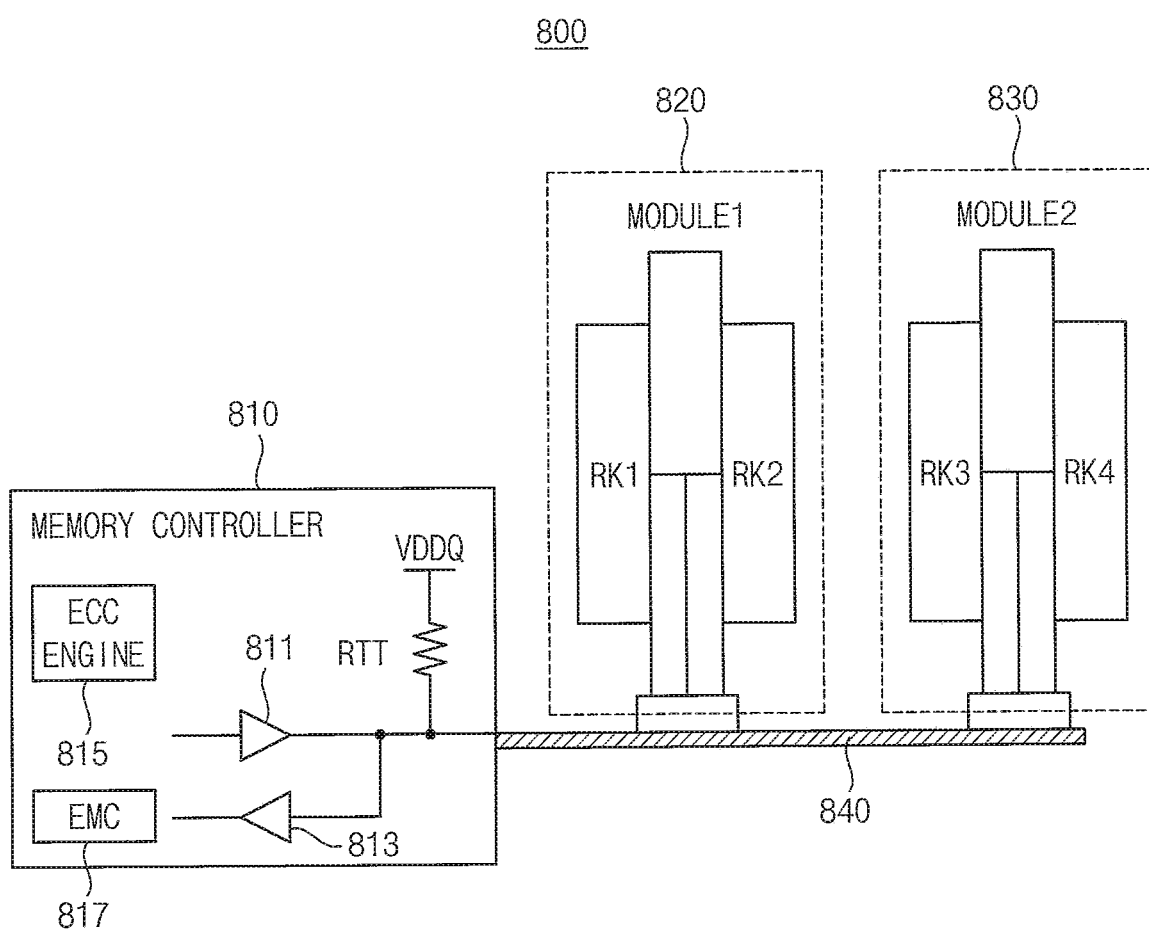
FIG. 26 is a block diagram of a memory system including quad-rank memory modules according to at least one embodiment.

FIG. 26 is a block diagram illustrating a memory system having quad-rank memory modules according to at least one embodiment.

Referring to FIG. 26, a memory system 800 includes a memory controller 810 and memory modules 820 and 830. The memory system 800 is an example of, or includes aspects of, the memory system 20 described with reference to FIG. 1. Two memory modules are depicted in FIG. 26. In some embodiments, memory system 800 includes fewer than or more than two memory modules.

According to some aspects, the memory controller 810 controls at least one of the memory modules 820 and 830 in response to a command received from a processor and/or host. According to some aspects, the memory controller 810 is implemented using processing circuitry (e.g., a processor). According to some aspects, the memory controller 810 is implemented with a host, an application processor, or a system-on-a-chip (SoC).

According to some aspects, a source termination is implemented with a resistor RTT on a bus 840 of the memory controller 810 to promote signal integrity. According to some aspects, the resistor RTT is coupled to a power supply voltage VDDQ. According to some aspects, the memory controller 810 includes a transmitter 811 that transmits a signal to at least one of the memory modules 820 and 830. According to some aspects, the memory controller 810 includes a receiver 813 that receives a signal from at least one of the memory modules 820 and 830.

According to some aspects, the memory controller 810 includes an ECC engine 815 and an error managing circuit (EMC) 817. According to some aspects, the ECC engine 130 described with reference to FIG. 6 is implemented as the ECC engine 815 and the EMC 400 described with reference to FIG. 15 is implemented as the EMC 817.

Accordingly, in some embodiments, the ECC engine 815 includes an ECC encoder and an ECC decoder, and the ECC decoder performs an ECC decoding on a read codeword from at least one of the memory modules 820 and 830 to generate a first syndrome and a second syndrome and provides the second syndrome associated with the correctable error to the EMC 817.

According to some aspects, the EMC 817 predicts an occurrence of an uncorrectable error in a memory region associated with the correctable errors based on accumulating the second syndromes and determines an error management policy for the memory region. Therefore, in some embodiments, the EMC 817 mitigates an occurrence of the uncorrectable error due to accumulated correctable errors in at least one of the memory modules 820 and 830. Accordingly, in some embodiments, the memory system 800 efficiently corrects and manages errors.

The memory modules 820 and 830 may be referred to as a first memory module 820 and a second memory module 830. According to some aspects, the first memory module 820 and the second memory module 830 are coupled to the memory controller 810 through the bus 840. According to some aspects, each of the first memory module 820 and the second memory module 830 are examples of, or include aspects of, the memory module MM described with reference to FIG. 1. According to some aspects, the first memory module 820 includes memory ranks RK1 and RK2, and the second memory module 830 includes memory ranks RK3 and RK4.

According to some aspects, each of the first memory module 820 and the second memory module 830 include a plurality of data chips, a first parity chip, and a second parity chip.

Figure 27:
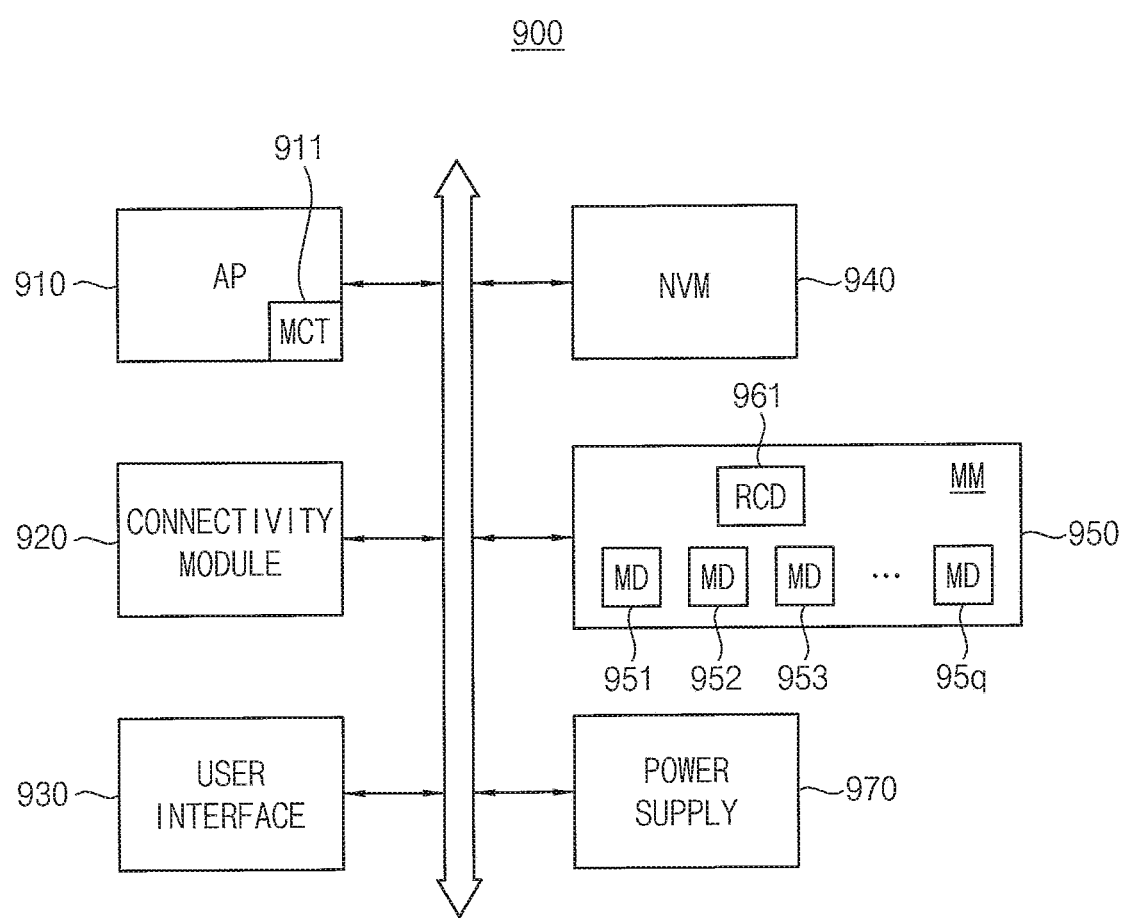
FIG. 27 is a block diagram of a mobile system including a memory module according to at least one embodiment.

FIG. 27 is a block diagram of a mobile system including a memory module according to at least one embodiment.

Referring to FIG. 27, according to some aspects, a mobile system 900 includes an application processor (AP) 910, a connectivity module 920, a memory module (MM) 950, a nonvolatile memory device 940, a user interface 930, and a power supply 970. According to some aspects, the application processor 910 includes a memory controller (MCT) 911. According to some aspects, the memory controller 911 includes the ECC engine 130 described with reference to FIG. 6 and the EMC 400 described with reference to FIG. 15.

According to some aspects, the application processor 910 executes applications, such as a web browser, a game application, a video player, etc. According to some aspects, the connectivity module 920 performs wired and/or wireless communication with an external device.

According to some aspects, the memory module 950 stores data processed by the application processor 910. According to some aspects, the memory module 950 operates as a working memory. According to some aspects, the memory module 950 includes a plurality of semiconductor memory devices (MD) 951, 952, 953, and 95$q$ (where q is a positive integer greater than three). According to some aspects, the memory module 950 includes a registered clock driver (RCD) 961.

According to some aspects, the semiconductor memory devices 951, 952, 953, and 95$q$ include a plurality of data chips, a first parity chip, and a second parity chip. The semiconductor memory devices 951, 952, 953, and 95$q$ are examples of, or include aspects of, the corresponding elements described with reference to FIG. 1. Accordingly, in some embodiments, the memory controller 911 performs an ECC decoding on a read codeword from the memory module 950 to generate a first syndrome and a second syndrome and provides the EMC 400 with the second syndrome associated with a correctable error. According to some aspects, the EMC 400 predicts an occurrence of an uncorrectable error in a memory region associated with the correctable errors based on accumulating the second syndromes as a plurality of second syndromes and determines an error management policy for the memory region.

According to some aspects, the nonvolatile memory device 940 stores a boot image for booting the mobile system 900. According to some aspects, the user interface 930 includes at least one input device, such as a keypad, a touch screen, etc., and at least one output device, such as a speaker, a display device, etc. According to some aspects, the power supply 970 supplies an operating voltage to the mobile system 900.

According to some aspects, the mobile system 900 or components of the mobile system 900 are mounted using various types of packages. Some embodiments are implemented in various systems including a memory module and a memory controller that includes an ECC engine.

According to some aspects, the nonvolatile memory device 940 stores a boot image for booting the mobile system 900. According to some aspects, the user interface 930 includes at least one input device, such as a keypad, a touch screen, etc., and at least one output device, such as a speaker, a display device, etc. According to some aspects, the power supply 970 supplies an operating voltage to the mobile system 900.

According to some aspects, the mobile system 900 or components of the mobile system 900 are mounted using various types of packages. Some embodiments are implemented in various systems including a memory module and a memory controller that includes an ECC engine.

While the inventive concept has been particularly shown and described with reference to embodiments thereof, it will be understood that various changes in form and detail may be made therein without departing from the spirit and scope of the present disclosure.

What is claimed is:

1. A memory controller configured to control a memory module including a plurality of data chips, a first parity chip and a second parity chip, the memory controller comprising:
    an error correction code (ECC) engine;
    a central processing unit (CPU) configured to control the ECC engine; and
    an error managing circuit,
    wherein the ECC engine is configured to:
        during a read operation, perform an ECC decoding on a read codeword set from the memory module to generate a first syndrome and a second syndrome associated with a correctable error in a user data set included in the read codeword set;
        correct the correctable error based on the first syndrome and the second syndrome; and
        provide the second syndrome to the error managing circuit, and
    wherein the error managing circuit is configured to:
        accumulate second syndromes associated with a plurality of correctable errors and obtained through a plurality of read operations as a plurality of second syndromes;
        store the plurality of second syndromes;
        compare the plurality of second syndromes with an error pattern set; and
        predict an occurrence of an uncorrectable error associated with the correctable error in a memory region of the plurality of data chips based on the comparison.

2. The memory controller of claim 1,
    wherein the error managing circuit compares the plurality of second syndromes with at least one of a first error pattern set and a second error pattern set,
    wherein the first error pattern set includes first error patterns associated with input/output pads through which user data is input and output in the plurality of data chips, and
    wherein the second error pattern set includes second error patterns associated with a burst length of the user data.

3. The memory controller of claim 2, wherein the error managing circuit is further configured to, in response to a pattern of the plurality of second syndromes corresponding to a risky error pattern that matches at least one of the first error pattern set and the second error pattern set:
    predict that a probability of the occurrence of the uncorrectable error is greater than a reference probability; and
    provide the CPU with an alert signal associated with the risky error pattern based on the prediction.

4. The memory controller of claim 3, wherein the error managing circuit is further configured to generate a repair signal for repairing the memory region based on the plurality of second syndromes and the alert signal.

5. The memory controller of claim 3, wherein the CPU is further configured to determine an error management policy for at least one memory region based in the alert signal.

6. The memory controller of claim 1, wherein the error managing circuit is further configured to:
    store the second syndrome associated with the correctable error;
    generate risky error information predicting the occurrence of the uncorrectable error based on comparing the plurality of second syndromes with the error pattern set;
    provide an alert signal to the CPU based on the risky error information; and
    provide a repair signal for repairing the at least one memory region based on the plurality of second syndromes to the CPU.

7. The memory controller of claim 1, wherein the error managing circuit includes:
    a syndrome register configured to store the second syndrome;
    a syndrome accumulation register connected to the syndrome register and configured to store the second syndromes and to accumulate the second syndromes as the plurality of the second syndromes;
    a risky error pattern register configured to store the error pattern set;
    a risky error determiner connected to the syndrome accumulation register and configured to generate risky error information predicting the occurrence of the uncorrectable error by comparing the plurality of second syndromes with the error pattern set;
    an alert signal generator configured to generate an alert signal associated with a risky error pattern based on the risky error information and to provide the alert signal to the CPU; and
    a repair signal generator configured to generate a repair signal for repairing the memory region based on the plurality of second syndromes and the alert signal and to provide the repair signal to the CPU.

8. The memory controller of claim 7, wherein the CPU is further configured to perform a post package repair on the memory region based on the alert signal and the repair signal.

9. The memory controller of claim 7, wherein the CPU is further configured to inhibit a use of the memory region based on the alert signal and the repair signal.

10. The memory controller of claim 1, wherein the ECC engine includes:
    an ECC memory configured to store a parity check matrix; and
    an ECC decoder configured to perform the ECC decoding and to provide the second syndromes to the error managing circuit.

11. The memory controller of claim 10, wherein the ECC decoder is further configured to determine that the correctable error occurs in the plurality of data chips in response to each of the first syndrome and the second syndrome including a non-zero value.

12. The memory controller of claim 10, wherein:
    the read codeword set further includes, metadata associated with the user data set, first parity data associated with locations of bit errors in the user data set, and second parity data associated with a quantity of the bit errors;
    the user data set is read from the plurality of data chips, the meta data and the first parity data are read from the first parity chip, and the second parity data is read from the second parity chip; and the parity check matrix includes a first parity sub matrix, a second parity sub matrix, and a third parity sub matrix.

13. The memory controller of claim 12, wherein the ECC decoder is configured to:
  generate the first syndrome by performing a first matrix-multiplication operation on the read codeword set and the first parity sub matrix; and
  generate the second syndrome by performing a second matrix-multiplication operation on the read codeword set, the second sub parity matrix, and the third parity sub matrix.

14. A memory system comprising:
  a memory module including a plurality of data chips, a first parity chip, and a second parity chip; and
  a memory controller configured to control the memory module and including:
    an error correction code (ECC) engine;
    a central processing unit (CPU) configured to control the ECC engine; and
    an error managing circuit,
  wherein the ECC engine is configured to:
    during a read operation, perform an ECC decoding on a read codeword set received from the memory module to generate a first syndrome and a second syndrome,
    wherein the read codeword set includes a user data set, the second syndrome is associated with a correctable error, and the user data set includes the correctable error;
    correct the correctable error in the user data set based on the first syndrome and the second syndrome; and
    provide the second syndrome to the error managing circuit, and
  wherein the error managing circuit is configured to:
    obtain second syndromes associated with a plurality of correctable errors through a plurality of read operations;
    accumulate the second syndromes as a plurality of second syndromes;
    store the plurality of second syndromes;
    compare the plurality of second syndromes with at least one error pattern set; and
    predict an occurrence of an uncorrectable error in a memory region of the plurality of data chips associated with the plurality of correctable errors based on the comparison.

15. The memory system of claim 14, wherein the at least one error pattern set includes a first error pattern set and a second error pattern set,
  wherein the first error pattern set includes first error patterns associated with input/output pads through which user data is input and output in the plurality of data chips, and
  wherein the second error pattern set includes second error patterns associated with a burst length of the user data.

16. The memory system of claim 15, wherein the error managing circuit is further configured to, in response to a pattern of the plurality of second syndromes corresponding to a risky error pattern that matches at least one of the first error pattern set and the second error pattern set:
  predict a probability that the occurrence of the uncorrectable error is greater than a reference probability; and
  provide an alert signal associated with the risky error pattern to the CPU.

17. The memory system of claim 14, wherein the error managing circuit is further configured to:
  store the second syndrome associated with the correctable error;
  generate risky error information predicting the occurrence of the uncorrectable error based on comparing the plurality of second syndromes with the at least one error pattern set;
  provide an alert signal to the CPU based on the risky error information; and
  provide a repair signal for repairing the memory region based on the plurality of second syndromes to the CPU.

18. The memory system of claim 14, wherein:
  the read codeword set further includes meta data associated with the user data set, first parity data associated with locations of bit errors in the user data set, and second parity data associated with a quantity of the bit errors; and
  the user data set is read from the plurality of data chips, the meta data and the first parity data are read from the first parity chip, and the second parity data is read from the second parity chip.

19. A memory module comprising:
  a plurality of data chips configured to store a user data set and meta data;
  a first parity chip and a second parity chip configured to store first parity data and second parity data, respectively, the first parity data and the second parity data being generated based on the user data set and the meta data; and
  a buffer chip configured to provide the user data set and the meta data to the plurality of data chips based on a command and an address provided from an external memory controller and further configured to provide the first parity data and the second parity data to the first parity chip and the second parity chip, respectively,
  wherein the buffer chip includes:
    an error correction code (ECC) engine;
    a memory management unit configured to control the ECC engine; and
    an error managing circuit,
  wherein the ECC engine is configured to:
    during a read operation, perform an ECC decoding on a read codeword set received from the memory module to generate a first syndrome and a second syndrome,
    wherein the read codeword set includes the user data set, the second syndrome is associated with a correctable error, and the user data set includes the correctable error;
    correct the correctable error in the user data set based on the first syndrome and the second syndrome; and
    provide the second syndrome to the error managing circuit, and
  wherein the error managing circuit is configured to:
    obtain second syndromes associated with a plurality of correctable errors through a plurality of read operations;
    accumulate the second syndromes as a plurality of second syndromes;
    store the plurality of second syndromes;
    compare the plurality of second syndromes with at least one error pattern set; and
    predict an occurrence of an uncorrectable error in a memory region of the plurality of data chips associated with the correctable error based on the comparison.

20. The memory module of claim 19, wherein the at least one error pattern set includes a first error pattern set and a second error pattern set,
- wherein the first error pattern set includes first error patterns associated with input/output pads through which user data is input and output in the plurality of data chips,
- wherein the second error pattern set includes second error patterns associated with a burst length of the user data, and
- wherein the error managing circuit is configured to, in response to a pattern of the plurality of second syndromes corresponding to a risky error pattern that matches at least one of the first error pattern set and the second error pattern set:
  - predict that a probability of the occurrence of the uncorrectable error is greater than a reference probability; and
  - provide an alert signal associated with the risky error pattern based on the prediction.

* * * * *